US011031409B2

(12) United States Patent
Lin et al.

(10) Patent No.: US 11,031,409 B2
(45) Date of Patent: Jun. 8, 2021

(54) CELL BOUNDARY STRUCTURE FOR EMBEDDED MEMORY

(71) Applicant: Taiwan Semiconductor Manufacturing Co., Ltd., Hsin-Chu (TW)

(72) Inventors: Meng-Han Lin, Hsinchu (TW); Chih-Ren Hsieh, Changhua (TW); Wei Cheng Wu, Zhubei (TW); Chih-Pin Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/574,220

(22) Filed: Sep. 18, 2019

(65) Prior Publication Data

US 2020/0058665 A1 Feb. 20, 2020

Related U.S. Application Data

(62) Division of application No. 15/998,422, filed on Aug. 15, 2018, now Pat. No. 10,644,013.

(51) Int. Cl.
*H01L 27/11548* (2017.01)
*H01L 29/423* (2006.01)
(Continued)

(52) U.S. Cl.
CPC .... *H01L 27/11548* (2013.01); *H01L 21/0337* (2013.01); *H01L 21/3212* (2013.01);
(Continued)

(58) Field of Classification Search
CPC ............. H01L 27/115; H01L 27/11512; H01L 27/11548; H01L 27/11575;
(Continued)

(56) References Cited

U.S. PATENT DOCUMENTS 8,455,923 B2  6/2013  Lee et al.
9,076,735 B2  7/2015  Leong et al.
(Continued)

OTHER PUBLICATIONS

Notice of Allowance dated Jan. 2, 2020 in connection with U.S. Appl. No. 15/998,422.
(Continued)

*Primary Examiner* — Sonya McCall-Shepard
(74) *Attorney, Agent, or Firm* — Eschweiler & Potashnik, LLC

(57) ABSTRACT

Various embodiments of the present application are directed to an embedded memory boundary structure with a boundary sidewall spacer, and associated forming methods. In some embodiments, an isolation structure is disposed in a semiconductor substrate to separate a memory region from a logic region. A memory cell structure is disposed on the memory region and a cell boundary structure is formed on the isolation structure including a boundary sidewall spacer. A protecting dielectric layer is disposed on a top surface of the boundary sidewall spacer. The boundary sidewall spacer and the protecting dielectric layer provide a smooth boundary sidewall that is not subject to damage during formation of the logic device structure and, hence, is not subject to trapping high κ etch residue during formation of the logic device structure with HKMG technology.

20 Claims, 12 Drawing Sheets

(51) Int. Cl.
    *H01L 29/66*      (2006.01)
    *H01L 23/532*     (2006.01)
    *H01L 27/11524*   (2017.01)
    *H01L 21/768*     (2006.01)
    *H01L 21/033*     (2006.01)
    *H01L 21/762*     (2006.01)
    *H01L 21/321*     (2006.01)

(52) U.S. Cl.
    CPC ...... *H01L 21/762* (2013.01); *H01L 21/76832* (2013.01); *H01L 23/5329* (2013.01); *H01L 27/11524* (2013.01); *H01L 29/42328* (2013.01); *H01L 29/66545* (2013.01); *H01L 29/66553* (2013.01)

(58) Field of Classification Search
    CPC ........ H01L 27/11595; H01L 29/42324–42328; H01L 2924/1434–1438; H01L 29/788; H01L 27/112–11597; H01L 29/66545–6656; H01L 21/762–76202; H01L 21/76829–76834; H01L 29/517–518; H01L 21/02175–02194
    See application file for complete search history.

(56) References Cited

U.S. PATENT DOCUMENTS

| | | | |
|---|---|---|---|
| 2010/0255647 A1* | 10/2010 | Yamakoshi | H01L 27/11546 438/211 |
| 2012/0299084 A1 | 11/2012 | Saito et al. | |
| 2014/0061926 A1 | 3/2014 | Han et al. | |
| 2015/0084111 A1* | 3/2015 | Wu | H01L 27/11548 257/316 |
| 2016/0181268 A1* | 6/2016 | Chuang | H01L 21/823842 257/314 |
| 2016/0307909 A1 | 10/2016 | Tseng et al. | |
| 2018/0151579 A1 | 5/2018 | Liu et al. | |
| 2018/0366587 A1 | 12/2018 | Le et al. | |

OTHER PUBLICATIONS

Non-Final Office Action dated Aug. 29, 2019 in connection with U.S. Appl. No. 15/998,422.

* cited by examiner

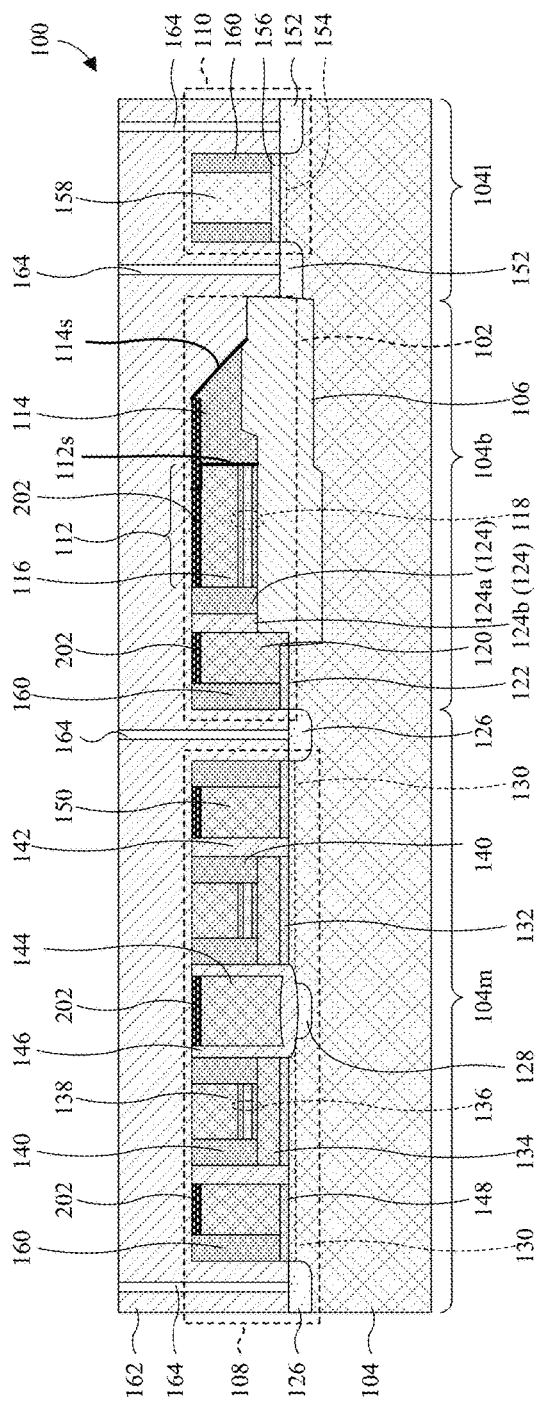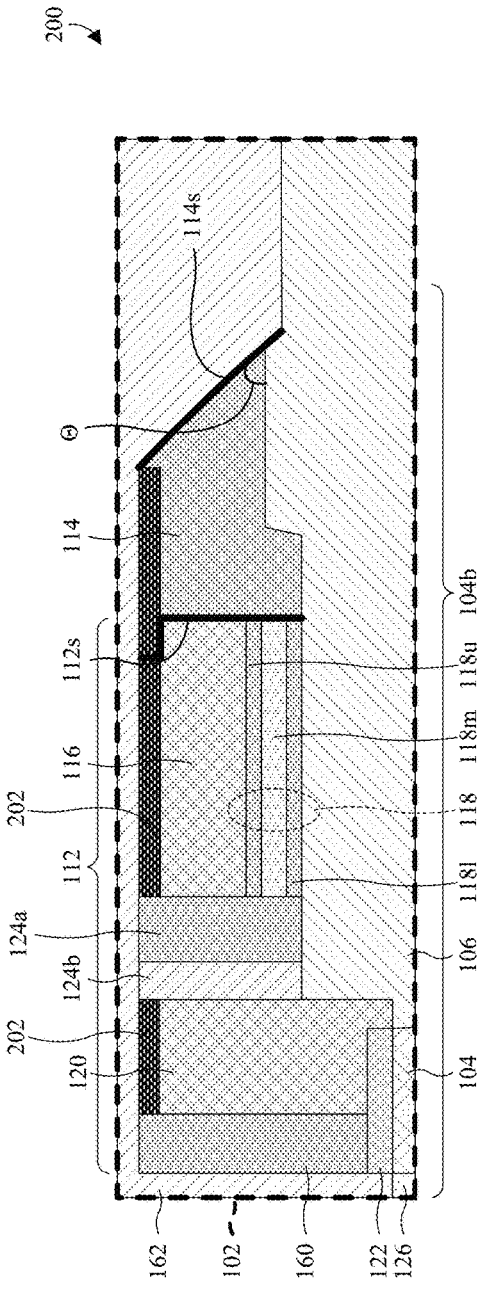
Fig. 1
Fig. 2

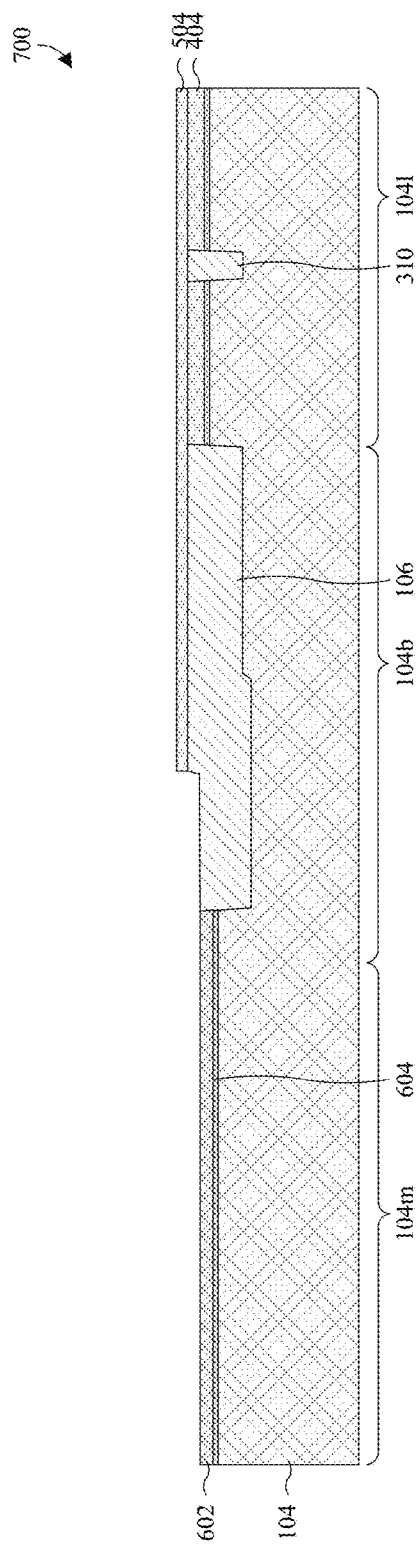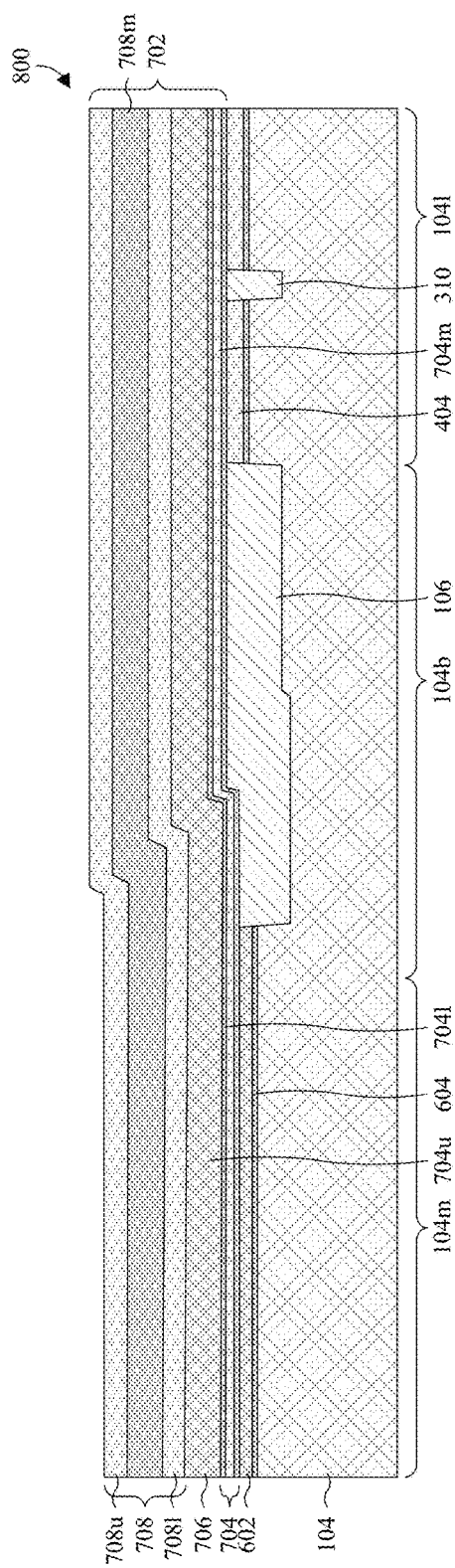

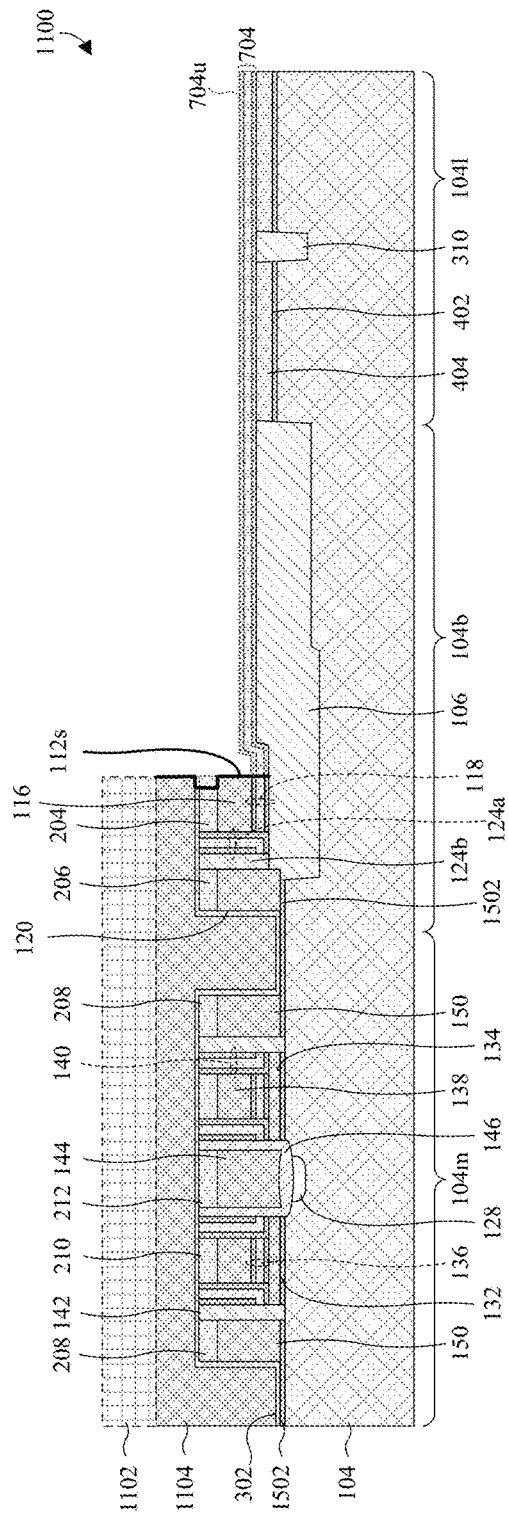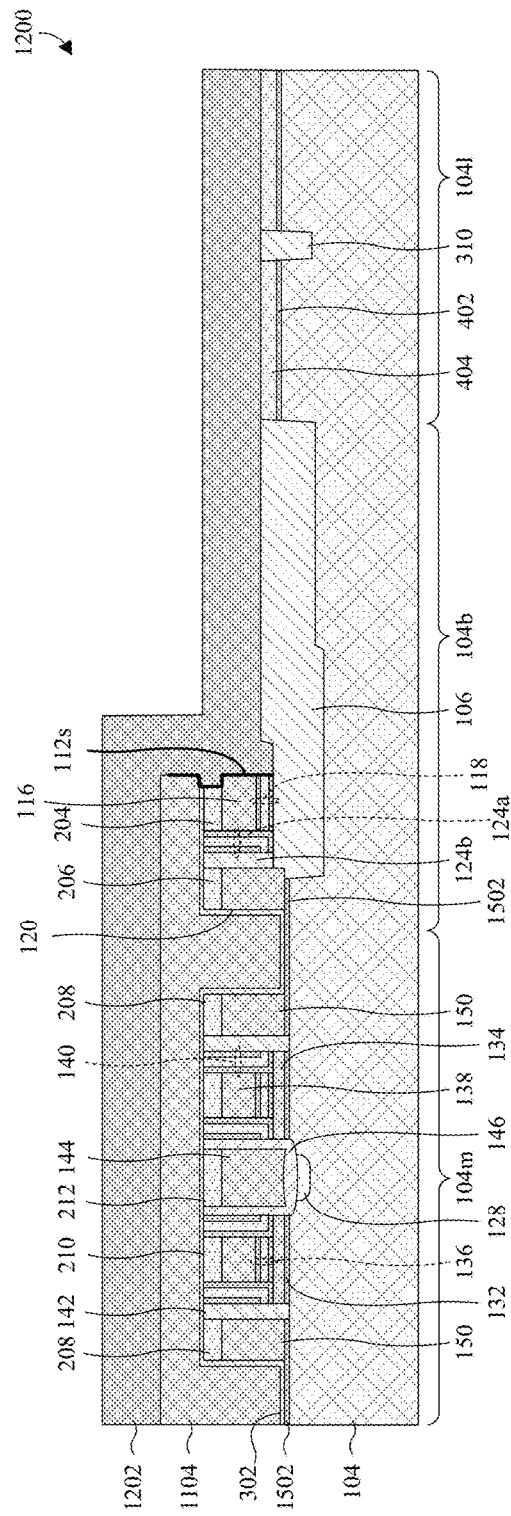

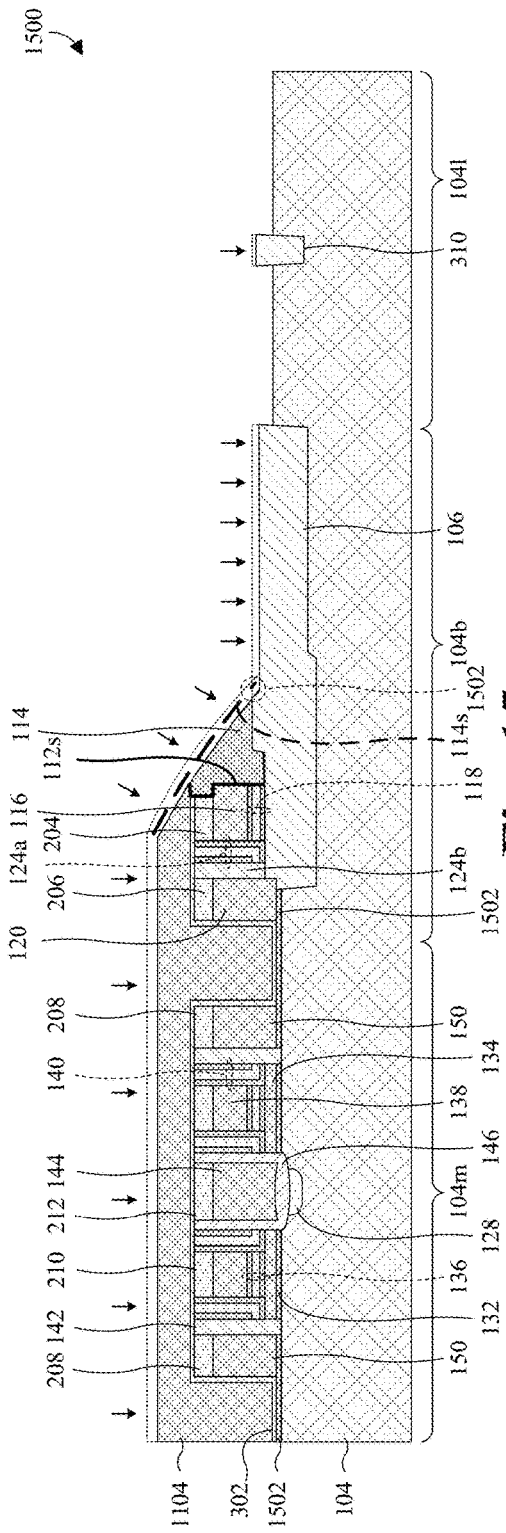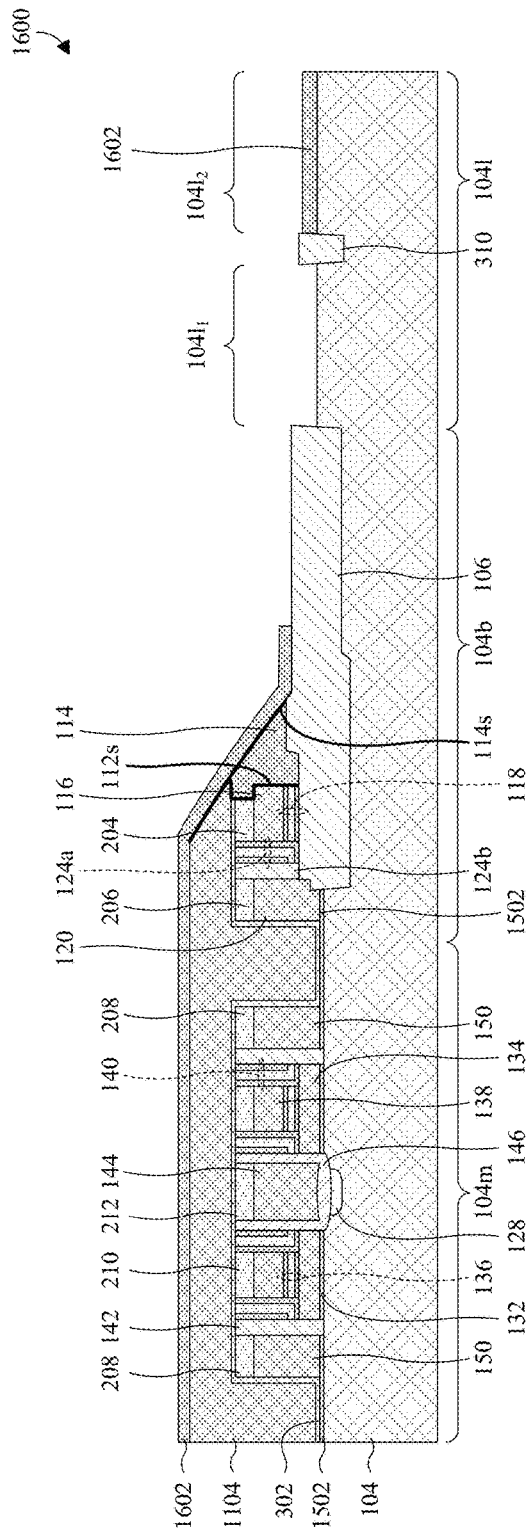

CELL BOUNDARY STRUCTURE FOR EMBEDDED MEMORY

REFERENCE TO RELATED APPLICATION

This Application is a Divisional of U.S. application Ser. No. 15/998,422, filed on Aug. 15, 2018, the contents of which are incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology and high κ metal gate (HKMG) technology. Embedded memory technology is the integration of memory devices with logic devices on the same semiconductor chip, such that the memory devices support operation of the logic devices. High κ metal gate (HKMG) technology is the manufacture of semiconductor devices using metal gate electrodes and high-κ gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 and 2 illustrate cross-sectional views of some embodiments of an integrated circuit (IC) comprising an embedded memory boundary structure with a boundary sidewall spacer.

FIGS. 4-22 illustrate a series of cross-sectional views for a method of forming an IC comprising an embedded memory boundary structure with a boundary sidewall spacer.

DETAILED DESCRIPTION

Figure 3:
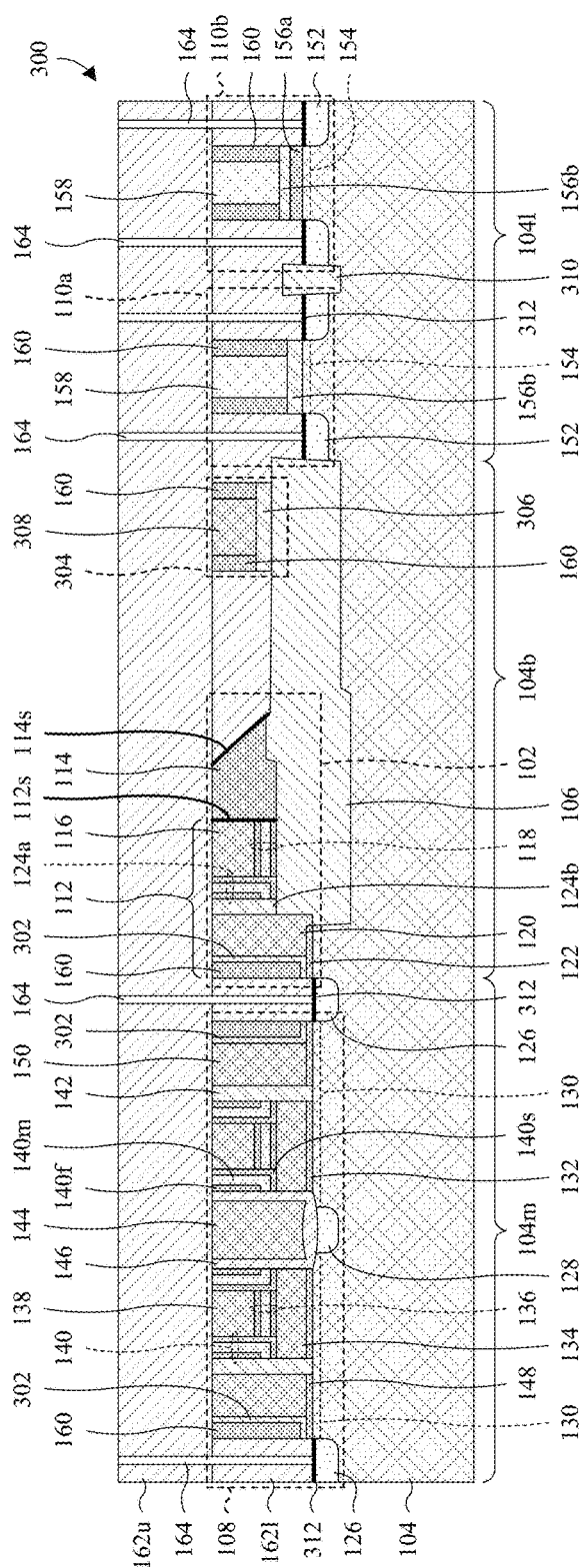
FIG. 3 illustrates a cross-sectional view of some additional embodiments of the IC from FIG. 1.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to some methods for manufacturing an integrated circuit (IC) with embedded memory technology and high κ metal gate (HKMG) technology, a boundary isolation structure is formed separating a memory region of a semiconductor substrate from a logic region of the semiconductor substrate. A multilayer film is formed covering the memory and logic regions and the boundary isolation structure. Memory devices are formed on the memory region from the multilayer film, and a dummy polysilicon (DPO) layer is formed covering the memory devices and the remaining multilayer film. An etch is performed on the multilayer film and the DPO layer, removing the multilayer film and the DPO layer from the logic region such that the remainder of the multilayer film and a remainder of the DPO layer collectively define a boundary sidewall that is smooth and faces the logic region on the boundary isolation structure. Logic devices are formed on the logic region using high κ gate dielectric layers and polysilicon gate electrodes. Subsequently, a HKMG replacement process is performed to replace the polysilicon gate electrodes with metal gate electrodes.

A challenge with the method described is that the formation of the logic devices involves dielectric material removal and re-deposition, which may damage the boundary sidewall so it is no longer smooth. For example, an etching process to remove previous pad dielectric layers or hard masks may lead to lateral undercutting, divots, and the like in the boundary sidewall Damaging the boundary sidewall may lead to fill issues, contamination, and/or other reliability issues during subsequent processing. For example, during formation of the logic devices, a high κ dielectric layer and a polysilicon layer may be formed lining the logic region and the boundary sidewall. The high κ dielectric layer and the polysilicon layer may then be patterned into the logic devices. Because the boundary sidewall is damaged during the third etch, high κ residue may remain on the boundary sidewall (e.g., within the divots or lateral undercuts) after patterning the high κ dielectric layer. High κ residue contamination may change parameters and even fail devices on the semiconductor substrate. Additionally, high κ residue may contaminate process tools used in subsequent processing, thereby contaminating other semiconductor substrates subsequently processed by the contaminated process tools.

In view of the foregoing, various embodiments of the present application are directed to a method for forming an IC comprising an embedded memory boundary structure with a boundary sidewall spacer. In some embodiments, an isolation structure is formed in a semiconductor substrate to separate a memory region of the semiconductor substrate from a logic region of the semiconductor substrate. A multilayer film is formed and patterned to form a memory cell structure on the memory region and a dummy structure on the isolation structure. A boundary sidewall spacer layer is formed and patterned to form a boundary sidewall spacer covering the dummy structure. A protecting dielectric layer is formed on a top surface of the boundary sidewall spacer. The protecting dielectric layer is concurrently removed when removing the lower pad layer and the upper pad layer in logic region. The boundary sidewall spacer protects the dummy structure from damage while the logic device structure is formed. The protecting dielectric layer protects the boundary isolation structure during the pad removal process and prevents the formation of an undercut at a connection point of the boundary sidewall spacer and the boundary isolation structure (described in more detail later, see content corresponding to FIG. 15 for example). Thereby, lateral undercutting, divots, and the like do not form along the dummy structure and/or the boundary sidewall spacer. Further, the boundary sidewall spacer may provide a smooth boundary sidewall that is not subject to damage during formation of the logic device structure (e.g., because of the material of the boundary sidewall, as seen hereafter) and, hence, is not subject to trapping high κ etch residue during formation of the logic device structure with HKMG technology. This in turn allows for complete removal of high κ etch residue, increasing the reliability of semiconductor devices formed on the semiconductor substrate.

With reference to FIG. 1, a cross-sectional view 100 of some embodiments of an IC comprising a cell boundary structure 102 for embedded memory is provided. The cell boundary structure 102 is on a boundary region 104b of a semiconductor substrate 104. The boundary region 104b separates a memory region 104m of the semiconductor substrate 104 from a logic region 104l of the semiconductor substrate 104. The semiconductor substrate 104 may be or otherwise comprise, for example, a bulk silicon substrate, a group III-V substrate, a silicon-on-insulator (SOI) substrate, or some other suitable semiconductor substrate(s). As used herein, a term (e.g., semiconductor substrate) with a suffix of "(s)" may, for example, be singular or plural. Further, the cell boundary structure 102 overlaps a boundary isolation structure 106 on the boundary region 104b. The boundary isolation structure 106 extends into the boundary region 104b and provides physical and electrical separation between embedded memory 108 on the memory region 104m and a logic device 110 on the logic region 104l. The boundary isolation structure 106 may be or otherwise comprise, for example, a shallow trench isolation (STI) structure, a deep trench isolation (DTI) structure, some other suitable trench isolation structure(s), or some other suitable isolation structure(s).

The cell boundary structure 102 comprises a dummy control gate structure 112 and a boundary sidewall spacer 114. The dummy control gate structure 112 defines a dummy sidewall 112s that faces the logic device 110 and that comprises multiple different materials. The multiple different materials may comprise, for example, silicon nitride, silicon oxide, polysilicon, some other suitable material(s), or any combination of the foregoing. Further, in some embodiments, the dummy sidewall 112s has an upper vertical portion and a lower vertical portion connected by a lateral portion. The upper vertical portion is recessed toward the memory region 104m relative to the lower vertical portion. The boundary sidewall spacer 114 overlies the boundary isolation structure 106, laterally between the dummy control gate structure 112 and the logic device 110, and borders the dummy sidewall 112s. In some embodiments, the boundary sidewall spacer 114 directly contacts the dummy sidewall 112s, and/or extends continuously along the dummy sidewall 112s from a bottommost edge of the dummy sidewall 112s to a topmost edge of the dummy sidewall 112s. The boundary sidewall spacer 114 may be or otherwise comprise, for example, silicon oxide, silicon nitride, silicon oxynitride, some other suitable dielectric(s), polysilicon, aluminum copper, tantalum, some other suitable metal(s) or metal alloy(s), tantalum nitride, titanium nitride, some other suitable metal nitride(s), or some other suitable material(s). Further, the boundary sidewall spacer 114 may be or otherwise comprise, for example, homogeneous (e.g., a single material).

A boundary sidewall 114s facing the logic device 110 is at least partially defined by the boundary sidewall spacer 114. In some embodiments, the boundary sidewall 114s is completely defined by the boundary sidewall spacer 114. In other embodiments, the boundary sidewall 114s is collectively defined by the boundary sidewall spacer 114 and the boundary isolation structure 106. In some of the other embodiments, a portion of the boundary sidewall 114s defined by the boundary isolation structure 106 is continuous with and/or flush with a portion of the boundary sidewall 114s defined by the boundary sidewall spacer 114. The boundary sidewall 114s is slanted downward towards the logic device 110. Further, the boundary sidewall 114s is smooth from top to bottom and, in some embodiments, extends continuously from top to bottom. For example, the boundary sidewall 114s may be smooth and/or extend continuously from a top edge of the boundary sidewall 114s to a bottom edge of the boundary sidewall 114s. The top edge of the boundary sidewall 114s may, for example, be even or substantially even with a top edge of the dummy sidewall 112s and/or a top surface of the boundary sidewall spacer 114. The bottom edge of the boundary sidewall 114s may, for example, be spaced above a bottom surface of the boundary sidewall spacer 114.

During formation of the IC, the boundary sidewall spacer 114 protects the dummy control gate structure 112 from damage and/or retaining residues while the logic device 110 is formed. Absent the boundary sidewall spacer 114, lateral undercutting, divots, and the like may form along the dummy sidewall 112s that may trap high κ etch residue generated during formation of the logic device 110 with HKMG technology. Further, the boundary sidewall spacer 114 has a smooth boundary sidewall 114s that is not subject to damage during formation of the logic device 110 (e.g., because of the material of the boundary sidewall 114s and because of the formation of a protecting dielectric layer, as described later) and, hence, is not subject to trapping high κ etch residue generated during formation of the logic device 110 with HKMG technology. This in turn allows for the complete removal of high κ etch residue generated during formation of the logic device 110 with HKMG technology, increasing the yield and the reliability of semiconductor devices formed on the semiconductor substrate 104.

In some embodiments, the dummy control gate structure 112 comprises a dummy control gate electrode 116 and a dummy control gate dielectric layer 118 stacked on the boundary isolation structure 106. The dummy control gate electrode 116 overlies the dummy control gate dielectric layer 118, and the dummy control gate electrode 116 and the dummy control gate dielectric layer 118 collectively define the dummy sidewall 112s. The dummy control gate electrode 116 may be or otherwise comprise, for example, doped polysilicon, metal, some other suitable conductive material(s), or any combination of the foregoing. The dummy control gate dielectric layer 118 may be or otherwise comprise, for example, silicon oxide, silicon nitride, silicon oxynitride, some other suitable dielectric(s), or any combination of the foregoing. In some embodiments, the dummy control gate dielectric layer 118 comprises a multilayer oxide-nitride-oxide (ONO) film, the constituents of which are illustrated but not individually labeled for ease of illustration. See, for example, FIG. 2 for a detailed labeling of the individual layers of the ONO film.

In some embodiments, the cell boundary structure 102 further comprises a dummy select gate electrode 120. The dummy select gate electrode 120 is on the boundary region 104b laterally between the boundary isolation structure 106 and the embedded memory 108. Further, the dummy select gate electrode 120 has a bottom surface spaced below the dummy control gate dielectric layer 118. The dummy select gate electrode 120 overlies a dummy select gate dielectric layer 122, and is laterally spaced from the dummy control gate electrode 116 by a dummy gate spacer 124. In some embodiments, the dummy gate spacer 124 may comprise a first dummy gate spacer 124a and a second dummy gate spacer 124b. The dummy gate spacer 124 overlies the boundary isolation structure 106. The dummy select gate electrode 120 may be or otherwise comprise, for example, doped polysilicon, metal, or some other suitable conductive material(s). Both the dummy select gate dielectric layer 122 and the dummy gate spacer 124 may be or otherwise comprise, for example, silicon oxide, silicon nitride, silicon oxynitride, some other suitable dielectric(s), or any combination of the foregoing.

The embedded memory 108 is on the memory region 104m and may be or otherwise comprise, for example, third generation embedded superflash (ESF3) memory, first generation embedded superflash (ESF1) memory, silicon-oxide-nitride-oxide-silicon (SONOS) memory, metal-oxide-nitride-oxide-silicon (MONOS) memory, or some other suitable type(s) of memory. In some embodiments, the embedded memory 108 comprises a pair of individual memory source/drain regions 126, a common memory source/drain region 128, and a pair of selectively-conductive memory channels 130. The individual memory source/drain regions 126 and the common memory source/drain region 128 are on top of the semiconductor substrate 104, and the common memory source/drain region 128 is laterally spaced between the individual memory source/drain regions 126. Further, the individual memory source/drain regions 126 and the common memory source/drain region 128 are doped semiconductor regions having a first doping type (e.g., p-type or n-type). The selectively-conductive memory channels 130 are doped semiconductor regions having a second doping type (e.g., p-type or n-type) opposite the first doping type.

A pair of floating gate dielectric layers 132, a pair of floating gate electrodes 134, a pair of control gate dielectric layers 136, and a pair of control gate electrodes 138 are stacked on the selectively-conductive memory channels 130. For ease of illustration, only one of the floating gate dielectric layers 132 is labeled 132, only one of the floating gate electrodes 134 is labeled 134, only one of the control gate dielectric layers 136 is labeled 136, and only one of the control gate electrodes 138 is labeled 138. The floating gate dielectric layers 132 respectively overlie the selectively-conductive memory channels 130 and may be or otherwise comprise, for example, silicon oxide or some other suitable dielectric(s). The floating gate electrodes 134 respectively overlie the floating gate dielectric layers 132. The control gate dielectric layers 136 respectively overlie the floating gate electrodes 134. The control gate electrodes 138 respectively overlie the control gate dielectric layers 136. The control and floating gate electrodes 138, 134 may be or otherwise comprise, for example, doped polysilicon, metal, or some other suitable conductive material(s). The control gate dielectric layers 136 may be or otherwise comprise, for example, silicon nitride, silicon oxide, some other suitable dielectric(s), or any combination of the foregoing. In some embodiments, the control gate dielectric layers 136 each comprise ONO films, such that the control gate dielectric layers 136 each comprise a lower oxide layer, an upper oxide layer, and a middle nitride layer sandwiched between the lower an upper oxide layers.

A pair of control gate spacers 140 overlies each of the floating gate electrodes 134, and the control gate spacers 140 of each floating gate electrode respectively line opposite sidewalls of a control gate electrode, which overlies the floating gate electrode. For ease of illustration, only some of the control gate spacers 140 are labeled 140. Floating gate spacers 142 respectively overlie the selectively-conductive memory channels 130, each laterally spaced from the common memory source/drain region 128 by one of the floating gate electrodes 134. Further, the floating gate spacers 142 each line a sidewall of one of the floating gate electrodes 134. In some embodiments, the first dummy gate spacer 124a has the same width and composition with the control gate spacer 140, and the second dummy gate spacer 124b has the same width and composition with the floating gate spacer 142. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 are each ONO films, the constituents of which are not shown for ease of illustration.

An erase gate electrode 144 and an erase gate dielectric layer 146 overlie the common memory source/drain region 128, laterally between the floating gate electrodes 134. The erase gate electrode 144 overlies the erase gate dielectric layer 146 and, in some embodiments, has a top surface even with top surfaces respectively of the control gate electrodes 138 and/or a top surface of the dummy control gate structure 112. The erase gate dielectric layer 146 cups an underside of the erase gate electrode 144 to vertically space the erase gate electrode 144 from the common memory source/drain region 128, and to laterally space the erase gate electrode 144 from the floating gate electrodes 134 and the control gate spacers 140. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s).

A pair of select gate dielectric layers 148 and a pair of select gate electrodes 150 are stacked on the selectively-conductive memory channels 130. For ease of illustration, only one of the select gate dielectric layers 148 is labeled 148, and only one of the select gate electrodes 150 is labeled 150. The select gate dielectric layers 148 respectively overlie the selectively-conductive memory channels 130, each laterally spaced from the common memory source/drain region 128 by a respective one of the floating gate electrodes 134. The select gate dielectric layers 148 may be or otherwise comprise, for example, silicon oxide, silicon nitride, or some other suitable dielectric(s). The select gate electrodes

150 may be or otherwise comprise, for example, doped polysilicon, metal, or some other suitable conductive material(s).

The logic device 110 is on the logic region 104*l* and may be or otherwise comprise, for example, an insulated field-effect transistor (IGFET), a metal-oxide-semiconductor field-effect transistor (MOSFET), a double-diffused metal-oxide-semiconductor (DMOS) device, a bipolar complementary metal-oxide-semiconductor (CMOS) DMOS (BCD) device, some other suitable transistor device(s), or some other suitable semiconductor device(s). In some embodiments, the logic device 110 comprises a pair of logic source/drain regions 152 and a selectively-conductive logic channel 154. The logic source/drain regions 152 are doped semiconductor regions having a first doping type (e.g., p-type or n-type) while the selectively-conductive logic channel 154 is a doped semiconductor region having a second, opposite doping type (e.g., p-type or n-type).

A logic gate dielectric layer 156 overlies the selectively-conductive logic channel 154, and a logic gate electrode 158 overlies the logic gate dielectric layer 156. The logic gate electrode 158 may be or otherwise comprise, for example, doped polysilicon, metal, or some other suitable conductive material(s). The logic gate dielectric layer 156 may be or otherwise comprise, for example, silicon nitride, silicon oxide, a high κ dielectric, some other suitable dielectric(s), or any combination of the foregoing. As used herein, a high κ dielectric has a dielectric constant κ greater than about 3.9, 5, 10, 15, or 20. In some embodiments, the logic gate dielectric layer 156 is a high κ dielectric and the logic gate electrode 158 is metal. Furthermore, some embodiments of the select gate electrodes 150, the erase gate electrode 144, the control gate electrodes 138, and the floating gate electrodes 134 may be or otherwise comprise doped polysilicon.

In some embodiments, main sidewall spacers 160 line the sidewalls of the select gate electrodes 150, a sidewall of the dummy select gate electrode 120, and the sidewalls of the logic gate electrode 158. For ease of illustration, only some of the main sidewall spacers 160 are labeled. The main sidewall spacers 160 may be or otherwise comprise, for example, silicon nitride, silicon oxide, or some other suitable dielectric(s), or any combination of the foregoing. Further, in some embodiments, an interlayer dielectric (ILD) layer 162 covers the embedded memory 108, the logic device 110, and the cell boundary structure 102. The ILD layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9, 3, 2, or 1. Furthermore, in some embodiments, contact vias 164 extend through the ILD layer 162 to the logic source/drain regions 152 and the individual memory source/drain regions 126. The contact vias 164 are conductive and may be or otherwise comprise, for example, tungsten, aluminum copper, copper, aluminum, some other suitable metal(s), or some other suitable conductive material(s). In some embodiments, a silicide layer 202 is disposed on the dummy control gate electrode 116, the dummy select gate electrode 120, and the boundary sidewall spacer 114. The silicide layer 202 is also disposed on the select gate electrodes 150 and the erase gate electrode 144 for contacting. The silicide layer 202 may be omitted in other figures below for simplicity reason, but can be arranged in the similar locations, e.g., on upper surfaces of the dummy control gate electrode, the dummy select gate electrode, the boundary sidewall spacer, the select gate electrodes 150, or the erase gate electrode.

With reference to FIG. 2, an enlarged cross-sectional view 200 of some embodiments of the cell boundary structure 102 in FIG. 1 is provided. In some embodiments, the dummy control gate dielectric layer 118 comprises a lower oxide layer 118*l*, an upper oxide layer 118*u* overlying the lower oxide layer 118*l*, and a middle nitride layer 118*m* vertically sandwiched between the lower oxide layer 118*l* and the upper oxide layer 118*u*. Further, in such embodiments, the dummy sidewall 112*s* is heterogeneous and comprises at least three different materials (e.g., silicon nitride, silicon oxide, and polysilicon).

The boundary sidewall 114*s* is slanted downward, away from the dummy sidewall 112*s*, and has a slant angle θ relative to a lateral surface of the boundary sidewall spacer 114. The slant angle θ may be or otherwise comprise, for example, less than about 60 degrees.

While FIGS. 1 and 2 illustrate specific configurations of the dummy control gate structure 112, the embedded memory 108, and the logic device 110, it is to be understood that other configurations of the dummy control gate structure 112, the embedded memory 108, the logic device 110, or any combination of the foregoing are amenable. For example, a different embedded memory type may be employed in place of the embedded memory 108 (see FIG. 1).

With reference to FIG. 3, a cross-sectional view 300 of some additional embodiments of the IC of FIGS. 1 and 2 are provided. As illustrated by the cross-sectional view 300 of FIG. 3, a cross-sectional view 300 of some more detailed embodiments of the integrated circuit of FIGS. 1 and 2 is provided. As illustrated, a dummy liner layer 302 underlies the main sidewall spacers 160 on the memory and boundary regions 104*m*, 104*b* and further spaces the main sidewall spacers 160 from the select gate electrodes 150 and the dummy select gate electrode 120. As above, only some of the main sidewall spacers 160 are labeled 160, and only one of the select gate electrodes 150 is labeled 150. The dummy liner layer 302 may be or otherwise comprise, for example, silicon oxide, silicon nitride, some other suitable dielectric(s), or any combination of the foregoing.

A logic boundary structure 304 overlies the boundary isolation structure 106 on the opposite side of the boundary isolation structure 106 as the cell boundary structure 102. The logic boundary structure 304 comprises a dummy logic gate dielectric layer 306 and a dummy logic gate electrode 308 overlying the dummy logic gate dielectric layer 306. The dummy logic gate electrode 308 may be or otherwise comprise, for example, doped polysilicon, metal, or some other suitable conductive material(s). The dummy logic gate dielectric layer 306 may be or otherwise comprise, for example, silicon nitride, silicon oxide, a high κ dielectric, some other suitable dielectric(s), or any combination of the foregoing. In some embodiments, the main sidewall spacers 160 comprise a pair of main sidewall spacers respectively lining opposite sides of the dummy logic gate electrode 308, and/or overlying the dummy logic gate dielectric layer 306.

A first logic device 110*a* and a second logic device 110*b* are on the logic region 104*l* of the semiconductor substrate 104, physically and electrically separated by a logic isolation structure 310 laterally between the first and second logic devices 110*a*, 110*b*. The logic isolation structure 310 may be or otherwise comprise, for example, an STI structure, a DTI structure, or some other suitable isolation structure(s). The first and second logic devices 110*a*, 110*b* may each be, for example, an IGFET, a MOSFET, a DMOS device, a BCD device, some other suitable transistor device(s), or some other suitable semiconductor device(s). In some embodiments, the first logic device 110*a* is an IGFET and the second logic device 110b is a power MOFSET configured to operate at higher voltages (e.g., voltages an order of magnitude higher) than the second logic device 110b. The power MOSFET may be or otherwise comprise, for example, a double-diffused metal-oxide-semiconductor (DMOS) device or some other suitable power MOSFET(s).

The first and second logic devices 110a, 110b each comprise a pair of logic source/drain regions 152 and a selectively-conductive logic channel 154. For ease of illustration, only some of the logic source/drain regions 152 are labeled. The logic source/drain regions 152 of each pair are laterally spaced on top of the semiconductor substrate 104. Further, the logic source/drain regions 152 of each pair are doped semiconductor regions having a first doping type (e.g., p-type or n-type). The selectively-conductive logic channel 154 is a doped semiconductor region having a second doping type (e.g., p-type or n-type) opposite the first doping type of the respective pair of logic source/drain regions 152.

The first logic device 110a and the second logic device 110b may have different gate dielectric compositions for different operation voltages. As an example for non-limiting purpose, a first logic gate dielectric layer 156a, a second logic gate dielectric layer 156b, and a logic gate electrode 158 are stacked on the selectively-conductive logic channel 154 of the first logic device 110a, while the first logic gate dielectric layer 156a is absent from the second logic device 110b. The logic gate electrodes 158 may be or otherwise comprise, for example, doped polysilicon, metal, or some other suitable conductive material(s). The first and second logic gate dielectric layer 156a, 156b may be or otherwise comprise, for example, silicon nitride, silicon oxide, a high κ dielectric, some other suitable dielectric(s), or any combination of the foregoing. In some embodiments, the first logic gate dielectric layers 156a are silicon oxide, the second logic gate dielectric layers 156b are a high κ dielectric, and the logic gate electrodes 158 are metal. In some embodiments, the main sidewall spacers 160 comprise a plurality of main sidewall spacers respectively lining sidewalls of the logic gate electrodes 158.

A lower ILD layer 162l and an upper ILD layer 162u are stacked on the semiconductor substrate 104 and accommodate the contact vias 164. For ease of illustration, only some of the contact vias 164 are labeled as such. The lower ILD layer 162l is to the sides of the embedded memory 108, laterally between the cell boundary structure 102 and the logic boundary structure 304, and to the sides of the first and second logic devices 110a, 110b. Further, the lower ILD layer 162l has a top surface that is even (e.g., planar or substantially planar) with a top surface of the embedded memory 108, a top surface of the cell boundary structure 102, a top surface of the logic boundary structure 304, a top surface of the first logic device 110a, and a top surface of the second logic device 110b. The upper ILD layer 162u covers the lower ILD layer 162l, the embedded memory 108, the cell boundary structure 102, the logic boundary structure 304, the first logic device 110a, and the second logic device 110b. The lower and upper ILD layers 162l, 162u may be or otherwise comprise, for example, silicon oxide, silicon nitride, a low κ dielectric, some other suitable dielectric(s), or any combination of the foregoing.

In some embodiments, the dummy select gate electrode 120 and the dummy control gate electrode 116 are laterally spaced by a first dummy gate spacer 124a and a second dummy gate spacer 124b. The first and second dummy gate spacers 124a and 124b overlie the boundary isolation structure 106 laterally between the dummy select gate electrode 120 and the dummy control gate electrode 116. In some embodiments, the first dummy gate spacer 124a has the same width as the control gate spacer 140 and the second dummy gate spacer 124b has the same width as the floating gate spacer 142. The first and second dummy gate spacers 124a, 124b may be or otherwise comprise, for example, silicon nitride, silicon oxide, some other suitable dielectric(s) or any combination of the foregoing. In some embodiments, the first dummy gate spacer 124a is an ONO film, the constituents of which are illustrated but not labeled for ease of illustration. Further, in some embodiments, the control gate spacers 140 overlying the floating gate electrodes 134 are or otherwise comprise ONO films, and/or silicide pads 312 respectively overlie the logic source/drain regions 152 and the individual memory source/drain regions 126. For ease of illustration, only one of the control gate spacers 140 is labeled 140, and only some of the silicide pads 312 are labeled 312. The ONO films may, for example, each comprises a first oxide layer 140f, a second oxide layer 140s, and a middle nitride layer 140m laterally sandwiched between the first and second oxide layers 140f, 140s. The silicide pads 312 may be or otherwise comprise, for example, be nickel silicide or some other suitable silicide(s).

With reference to FIGS. 4-22, a series of cross-sectional views 400-2200 illustrate some embodiments of a method for forming an IC comprising an embedded memory boundary structure with a boundary sidewall spacer.

Figure 4:
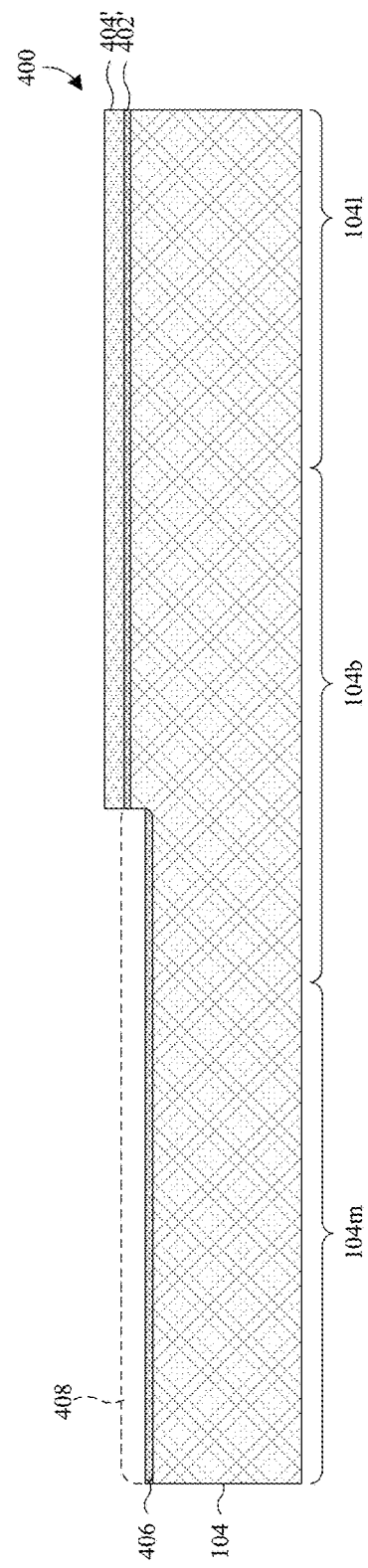

As illustrated by the cross-sectional view 400 of FIG. 4, a semiconductor substrate 104 is prepared including a memory region 104m and a logic region 104l separated by a boundary region 104b. The semiconductor substrate 104 is recessed in the memory region 104m and a sacrificial dielectric layer 406 is formed in the memory region 104m.

In some embodiments, a sacrificial lower pad layer 402' is firstly formed covering the semiconductor substrate 104, and a sacrificial upper pad layer 404' is formed covering the sacrificial lower pad layer 402'. The sacrificial lower and upper pad layers 402', 404' are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The sacrificial lower pad layer 402' may, for example, be formed of silicon oxide or some other suitable dielectric(s), and/or the sacrificial upper pad layer 404' may, for example, be formed by silicon nitride or some other suitable dielectric(s). Then, the sacrificial upper pad layer 404' is patterned to form an opening corresponding to the memory region 104m and to cover a logic region 104l. A precursor layer 408 is formed from a top surface of the semiconductor substrate 104 and thus reduce a height of the top surface of the semiconductor substrate 104. In some embodiments, the precursor layer 408 is an oxide layer and formed by a wet process. The precursor layer 408 is subsequently partially removed and a lower remaining portion of the precursor layer 408 forms the sacrificial dielectric layer 406.

Figure 5:
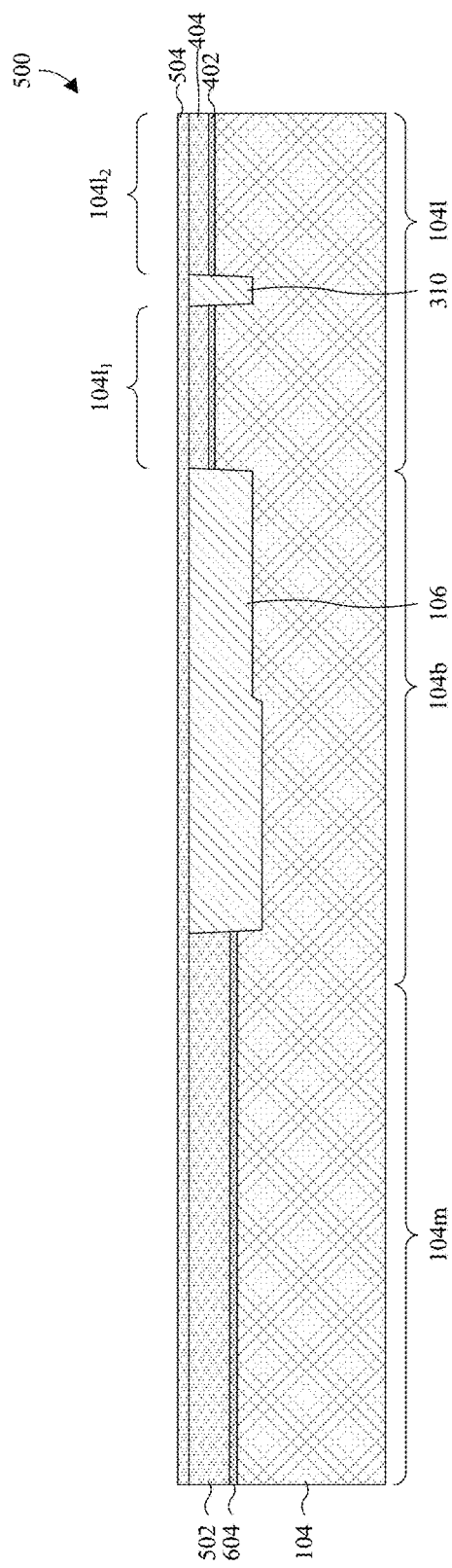

As illustrated by the cross-sectional view 500 of FIG. 5, the sacrificial dielectric layer 406 and the sacrificial lower pad layer 402' may be removed and replaced with a memory dielectric layer 604 in the memory region 104m and a lower pad layer 402 in the logic region 104l. The sacrificial upper pad layer 404' is removed and replaced with a memory pad layer 502 formed on the memory dielectric layer 604 in the memory region 104m and an upper pad layer 404 formed on the lower pad layer 402 in the logic region 104l. The upper pad layers 502, 404 may be a dielectric material deposited as one conformal layer. Then the portion of the conformal dielectric material in the memory region 104m is etched and patterned to have a top surface aligned with that of the portion of the conformal dielectric material in the logic region 104l. The memory pad layer 502 and the upper pad layer 404 may be made of the same or different materials. A boundary isolation structure 106 is formed in the boundary region 104b of the semiconductor substrate 104. The boundary isolation structure 106 provides electrical separation between semiconductor devices formed hereafter on the memory region 104m and the logic region 104l. The boundary isolation structure 106 may, for example, have a stepped bottom surface stepping up from the memory region 104m to the logic region 104l, and/or may, for example, comprise a dielectric material. Further, the boundary isolation structure 106 may be or otherwise comprise, for example, an STI structure, a DTI structure, or some other suitable isolation region(s). The semiconductor substrate 104 may be or otherwise comprise, for example, a bulk silicon substrate, an SOI substrate, a group III-V substrate, or some other suitable semiconductor substrate(s). Also illustrated by the cross-sectional view 600 of FIG. 6, a logic isolation structure 310 may be formed in the logic region 104l dividing the logic region 104l into a first logic region $104l_1$ and a second logic region $104l_2$. The first logic region $104l_1$ is laterally between the boundary isolation structure 106 and the second logic region $104l_2$. The first logic region $104l_1$ may, for example, support core logic devices formed hereafter, whereas the second logic region $104l_2$ may, for example, support high voltage logic devices formed hereafter. The high voltage logic devices may, for example, be logic devices configured to operate at higher voltages (e.g., an order of magnitude higher) than the core logic devices. The logic isolation structure 310 may, for example, comprise a dielectric material, and/or may be or otherwise comprise, for example, an STI structure, a DTI structure, or some other suitable isolation region(s). In some embodiments, a process for forming the boundary isolation structure 106 and the logic isolation structure 310 comprises patterning the upper pad layers 404, 502 with layouts of the boundary and logic isolation structures 106, 310, and performing an etch into the semiconductor substrate 104 with the lower and upper pad layers 402, 404, 502 in place to form trenches. A dielectric layer is formed covering the upper pad layers 404, 502 filling the trenches, and a planarization is performed on the upper pad layers 404 and 502 to form the boundary and logic isolation structures 106, 310 in the trenches. The planarization may, for example, be performed by a chemical mechanical polish (CMP) or some other suitable planarization process(es). The patterning may, for example, be performed using photolithography and an etching process. A dielectric capping layer 504 is then formed on the upper pad layers 404, 502 and the boundary and logic isolation structures 106 and 310. The dielectric layer and the dielectric capping layer 504 may, for example, be formed of silicon oxide, silicon nitride, and/or some other suitable dielectric material(s), and/or may, for example, be performed by CVD, PVD, sputtering, or some other suitable deposition process(es).

Figure 6:
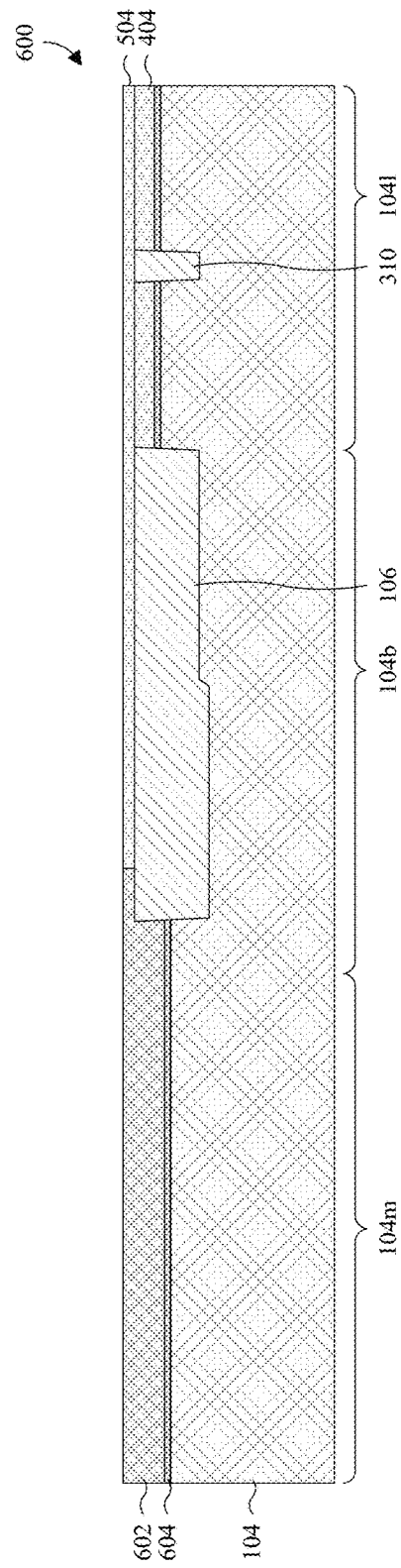

As illustrated by the cross-sectional view 600 of FIG. 6, the capping layer 504 is formed and patterned to act as a masking layer for patterning the floating gate layer 602. The capping layer 504 is formed and patterned to have an opening corresponding to the memory region 104m and a portion of the isolation structure 106 closer to the memory region 104m, and to cover a remaining portion of the isolation structure 106 closer to the logic region 104l and the logic region 104l. A floating gate layer 602 is formed and patterned on the memory dielectric layer 604. The floating gate layer 602 is firstly formed over the memory dielectric layer 604 and the capping layer 504 covering the memory region 104m, the boundary region 104b, and the logic region 104l. The floating gate layer 602 may, for example, be formed conformally, and/or may, for example, be formed of doped polysilicon, metal, or some other suitable conductive material(s). In some embodiments, the floating gate layer 602 is formed by CVD, PVD, or some other suitable deposition process(es). Then, a planarization is performed into the top of the floating gate layer 602 until the capping layer 504 is reached, thereby removing the floating gate layer 602 from the capping layer 504. In some embodiments, the planarization recesses a topmost surface of the floating gate layer 602 to about even with a topmost surface of the capping layer 504. The planarization may, for example, be performed by a CMP or some other suitable planarization process(es).

As illustrated by the cross-sectional view 700 of FIG. 7, the floating gate layer 602 is further lowered for better couple ratio. In some embodiments, the portion of the isolation structure 106 exposed by the capping layer 504 and closer to the memory region 104m is lowered together with the floating gate layer 602. The floating gate layer 602 may be lowered by a wet etching back process. After lowering the floating gate layer 602, the capping layer 504 may be subsequently removed.

As illustrated by the cross-sectional view 800 of FIG. 8, a multilayer memory film 702 is formed covering the floating gate layer 602, the boundary and logic isolation structures 106, 310, and the upper pad layer 404. The multilayer memory film 702 comprises a control gate dielectric layer 704, a control gate layer 706, and a control gate hard mask layer 708.

The control gate dielectric layer 704 is formed covering the floating gate layer 602, the boundary and logic isolation structures 106, 310, and the upper pad layer 404. In some embodiments, the control gate dielectric layer 704 comprises silicon oxide, silicon nitride, some other suitable dielectric(s), or any combination of the foregoing. For example, the control gate dielectric layer 704 may be an ONO film, and/or may comprise a lower oxide layer 704l, a middle nitride layer 704m covering the lower oxide layer 704l, and an upper oxide layer 704u covering the middle nitride layer 704m. The control gate dielectric layer 704 may, for example, be formed by CVD, PVD, some other suitable deposition process(es), or any combination of the foregoing.

The control gate layer 706 is formed covering the control gate dielectric layer 704. The control gate layer 706 may, for example, be formed conformally, and/or may, for example, be formed of doped polysilicon, metal, or some other suitable conductive material(s). Further, in some embodiments, the control gate layer 706 is formed by CVD, PVD, or some other suitable deposition process(es).

The control gate hard mask layer 708 is formed covering the control gate layer 706. In some embodiments, the control gate hard mask layer 708 comprises silicon oxide, silicon nitride, some other suitable dielectric(s), or any combination of the foregoing. For example, the control gate hard mask layer 708 may be a nitride-oxide-nitride (NON) film, and/or may comprise a lower nitride layer 708l, a middle oxide layer 708m covering the lower nitride layer 708l, and an upper nitride layer 708u covering the middle oxide layer 708m. The control gate hard mask layer 708 may, for example, be formed by CVD, PVD, some other suitable deposition process(es), or any combination of the foregoing.

Figure 9:
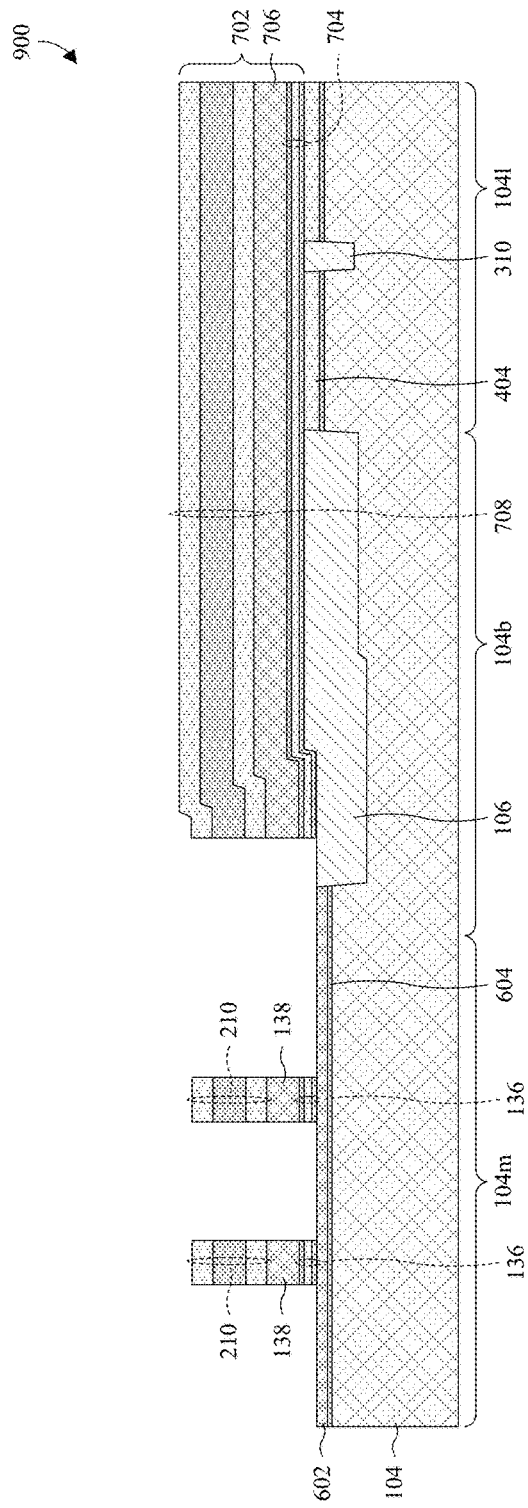

As illustrated by the cross-sectional view 900 of FIG. 9, an etch is performed into the multilayer memory film 702 to remove portions of the multilayer memory film 702 from the memory region 104m, thereby forming a pair of control gate electrodes 138 on the floating gate layer 602. Further, the etch forms a pair of control gate dielectric layers 136 and a pair of control gate hard masks 210. The control gate dielectric layers 136 respectively underlie the control gate electrodes 138, and the control gate hard masks 210 respectively overlie the control gate electrodes 138. In some embodiments, a process for performing the etch comprises forming and patterning a masking layer (e.g. a photoresist layer not shown in the figure) on the multilayer memory film 702 to cover the boundary region 104b and the logic region 104l, and partially cover the memory region 104m with a layout for the control gate electrodes 138. An etchant is then applied to the multilayer memory film 702 with the masking layer in place until the etchant reaches the floating gate layer 602, and the masking layer is thereafter removed.

Figure 10:
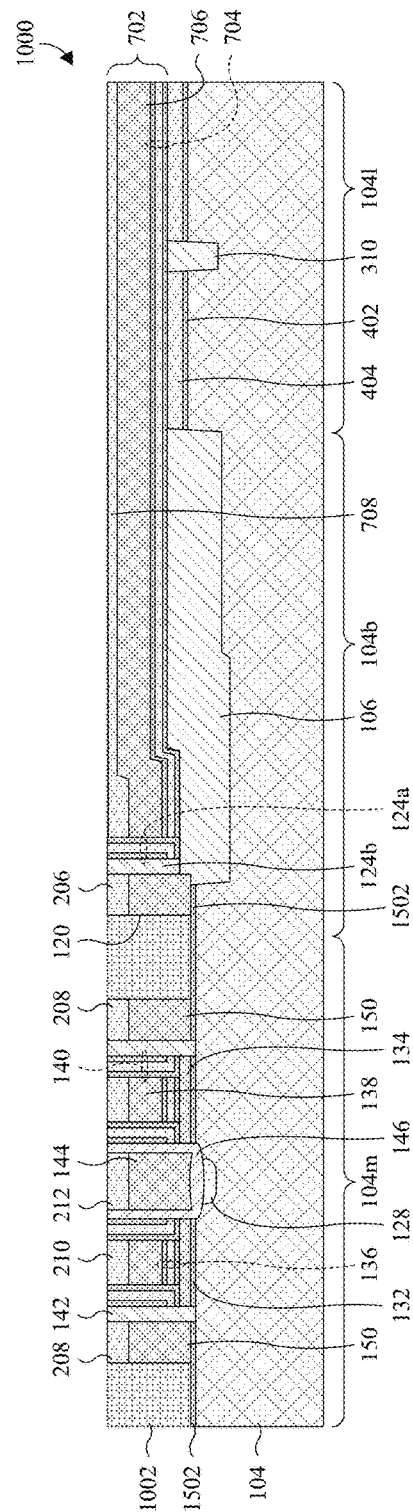

As illustrated by the cross-sectional view 1000 of FIG. 10, a series of manufacturing processes is performed so a memory cell structure is formed on the memory region 104m from multilayer memory film 702, while leaving a remainder of multilayer memory film 702 on boundary isolation structure 106 and logic region 104l. Some of the manufacturing processes are described below as an example and not for limiting purpose.

A control gate spacer 140 is formed along sidewalls of the control gate electrodes 138; and a first dummy gate spacer 124a is formed overlying the boundary isolation structure 106, along a sidewall of the multilayer memory film 702 facing the memory region 104m. In some embodiments, the control gate spacer 140 and the first dummy gate spacer 124a are formed by depositing a control gate spacer layer lining the structure of FIG. 9 followed by performing an etch on the control gate spacer layer until horizontal segments of the control gate spacer layer are removed. The control gate spacer layer may, for example, be formed conformally, and/or may, for example, be formed of silicon oxide, silicon nitride, some other suitable dielectric(s), or any combination of the foregoing. In some embodiments, the control gate spacer layer is or otherwise comprise an ONO film. Further, the control gate spacer layer may, for example, be formed by CVD, PVD, or some other suitable deposition process(es).

An etch is performed into the floating gate layer 602 (see FIG. 9) and the memory dielectric layer 604, with the control gate spacers 140 and the first dummy gate spacer 124a in place, to form a pair of floating gate electrodes 134 and a pair of floating gate dielectric layers 132. The floating gate electrodes 134 respectively underlie the control gate electrodes 138 and are formed from the floating gate layer 602. The floating gate dielectric layers 132 respectively underlie the floating gate electrodes 134 and are formed from the memory dielectric layer 604. During the etch, the control gate spacers 140 and the control gate hard masks 210 serve as a mask.

A floating gate spacer 142 is formed on sidewalls of the floating gate electrodes 134 and the control gate spacers 140. Further, a second dummy gate spacer 124b is formed on a sidewall of the first dummy gate spacer 124a. In some embodiments, the floating gate spacers 142 and the second dummy gate spacer 124b comprise silicon oxide, some other suitable oxide(s), or some other suitable dielectric(s). Further, in some embodiments, a process for forming the floating gate spacers 142 and the second dummy gate spacer 124b comprises depositing a floating gate spacer layer followed by an etch to remove horizontal segments of the floating gate spacer layer without removing vertical segments of the floating gate spacer layer. The floating gate spacer layer may, for example, be deposited conformally, and/or may, for example, be formed by CVD, PVD, or some other suitable deposition process(es).

A common memory source/drain region 128 is formed in the semiconductor substrate 104, laterally between the floating gate electrodes 134. In some embodiments, a process for forming the common memory source/drain region 128 comprises forming and patterning a masking layer covering the logic and boundary regions 104l, 104b, and further covering the memory region 104m outside a common source/drain gap laterally between the floating gate electrodes 134. Ion implantation or some other suitable doping process(es) is performed with the masking layer in place, and the masking layer is thereafter removed.

An erase gate dielectric layer 146 is formed covering the common memory source/drain region 128, and further lining sidewalls of the floating gate electrodes 134 and sidewalls of the control gate spacers 140 within the common source/drain gap. The erase gate dielectric layer 146 may, for example, be formed of oxide, nitride, or some other suitable dielectric(s). In some embodiments, a process for forming the erase gate dielectric layer 146 comprises high temperature oxidation (HTO), in situ steam generation (ISSG) oxidation, some other suitable deposition or growth process(es), or any combination of the foregoing. Further, in some embodiments, the process comprises removing dielectric material that forms on portions of the memory region 104m outside the common source/drain gap.

A memory dielectric layer 1502 is formed covering portions of the memory region 104m on opposite sides of the floating gate electrodes 134. The memory dielectric layer 1502 may, for example, be formed of oxide, nitride, or some other suitable dielectric(s). The memory dielectric layer 1502 may, for example, be formed by HTO, ISSG oxidation, some other suitable deposition or growth process(es), or any combination of the foregoing. A memory gate layer and a memory hard mask layer is formed on the memory dielectric layer 1502. The memory hard mask layer is patterned to form a pair of select gate hard masks 208 on opposite sides of the common memory source/drain region 128, an erase gate hard mask 212 overlying the common memory source/drain region 128, and a dummy select gate hard mask 206 bordering a sidewall of the boundary isolation structure 106. An additional etch is performed into the memory gate layer with the select gate hard masks 208, the erase gate hard mask 212, and the dummy select gate hard mask 206 in place to form a pair of select gate electrodes 150, an erase gate electrode 144, and a dummy select gate electrode 120. The memory gate layer may, for example, be formed conformally, and/or may, for example, be formed of doped polysilicon, metal, or some other suitable conductive material(s). The memory gate layer may, for example, be formed by CVD, PVD, or some other suitable deposition process(es).

Then, a first hard mask ARC 1002 is formed covering the structure described above followed by a planarization process. As such, a top surface of the first hard mask ARC 1002, top surfaces of the hard masks 210, 212, 208, 206, and a top surface of the control gate hard mask layer 708 are etched back together once the first hard mask ARC 1002 is sufficiently etched to expose lower portions of the hard masks 210, 212, 208, 206 and the control gate hard mask layer 708. Further, in some embodiments, the first hard mask ARC 1002 is removed after the etch by, for example, another etching process or some other suitable removal process(es). The first hard mask ARC 1002 may be formed by a coating process or may be deposited by, for example, CVD, PVD, or some other suitable deposition process(es). The planarization may, for example, be performed by a CMP or some other suitable planarization process(es).

As illustrated by the cross-sectional view 1100 of FIG. 11, a dummy liner layer 302 is formed covering the structure of FIG. 10. The dummy liner layer 302 may, for example, be formed conformally. In some embodiments, the dummy liner layer 302 is formed of silicon oxide or some other suitable dielectric(s). A first dummy capping layer 1104 is formed covering the dummy liner layer 302. In some embodiments, the first dummy capping layer 1104 is formed of polysilicon or some other suitable material(s). Further, the dummy liner layer 302 and/or the first dummy capping layer 1104 may, for example, be formed by CVD, PVD, some other suitable deposition process(es), or any combination of the foregoing, followed by a planarization process.

Also illustrated by the cross-sectional view 1100 of FIG. 11, an etch is performed into the first dummy capping layer 1104, the dummy liner layer 302, and the multilayer memory film 702 (see FIG. 10) to form a dummy control gate dielectric layer 118, a dummy control gate electrode 116 overlying the dummy control gate dielectric layer 118, and a dummy control gate hard mask 204 overlying the dummy control gate electrode 116. In some embodiments, the etch is performed by forming and patterning a photoresist layer 1102 covering the memory region 104m and part of the boundary isolation structure 106. An etchant is then applied to the first dummy capping layer 1104, the dummy liner layer 302, the control gate hard mask layer 708 (see FIG. 10), and the control gate layer 706 (see FIG. 10) according to the patterned photoresist layer 1102, stopping on the upper oxide layer 704u of the control gate dielectric layer 704. The control gate dielectric layer 704 is then etched, and a portion of the dummy control gate hard mask 204 facing the logic region is concurrently removed with the control gate dielectric layer 704 (removed part by the process is shown by dotted lines). Such that the dummy control gate hard mask 204 has a sidewall recessed back relative to sidewalls of the dummy control gate dielectric layer 118 and the dummy control gate electrode 116. Collectively, the dummy control gate dielectric layer 118, the dummy control gate electrode 116, the dummy control gate hard mask 204, the dummy liner layer 302, and the first dummy capping layer 1104 define a dummy sidewall 112s that overlies the boundary isolation structure 106 and that faces the logic region 104l. The dummy sidewall 112s is heterogeneous (e.g., multiple materials), and has an upper vertical portion and a lower vertical portion connected by a lateral portion, wherein the upper vertical portion is recessed toward the memory region 104m relative to the lower vertical portion. The photoresist layer 1102 is thereafter stripped.

As illustrated by the cross-sectional view 1200 of FIG. 12, a boundary sidewall spacer layer 1202 is formed covering the first dummy capping layer 1104, the boundary isolation structure 106, and the logic region 104l, and is further formed lining the dummy sidewall 112s. In some embodiments, the boundary sidewall spacer layer 1202 is formed of polysilicon, amorphous silicon, metal, a metal nitride, a dielectric, the same material as the first dummy capping layer 1104, a different material than the upper pad layer 404, or some other suitable material(s). For example, the boundary sidewall spacer layer 1202 may be formed of tungsten, aluminum copper, tantalum, tantalum nitride, or some other suitable metal(s) or metal nitride(s). As another example, the boundary sidewall spacer layer 1202 may be formed of oxide, silicon nitride, silicon oxynitride, or some other suitable dielectric(s). The boundary sidewall spacer layer 1202 may, for example, be formed conformally, and/or may, for example, be formed by CVD, PVD, some other suitable deposition process(es), or any combination of the foregoing.

Figure 13:
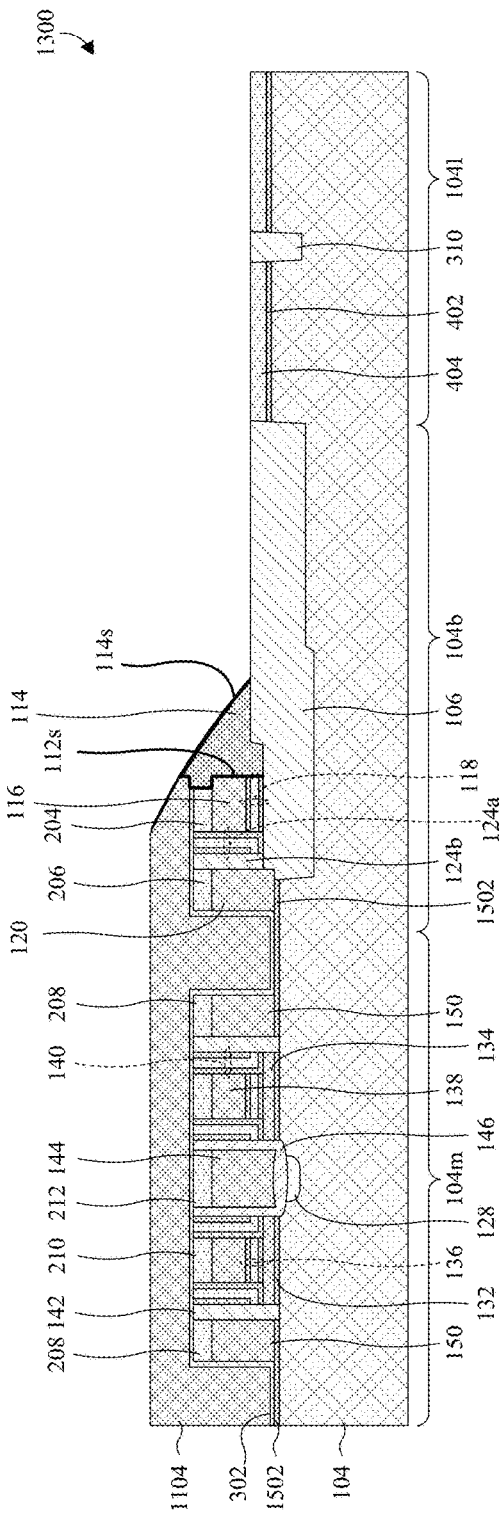

As illustrated by the cross-sectional view 1300 of FIG. 13, an etch is performed into the boundary sidewall spacer layer 1202 (see FIG. 12) to remove horizontal segments of the boundary sidewall spacer layer 1202 without removing vertical segments of the boundary sidewall spacer layer 1202, thereby forming a boundary sidewall spacer 114 on the dummy sidewall 112s. The boundary sidewall spacer 114 and the first dummy capping layer 1104 collectively define a boundary sidewall 114s that overlies the boundary isolation structure 106 and that faces the logic region 104l. In some embodiments, a portion of the boundary sidewall 114s defined by the first dummy capping layer 1104 is continuous with a portion of the boundary sidewall 114s defined by the boundary sidewall spacer 114. Further, the boundary sidewall 114s is smooth or substantially smooth, and is slanted downward towards the logic region 104l. In some embodiments, the boundary sidewall 114s extends continuously from a top surface of the first dummy capping layer 1104 to a bottom surface of the boundary sidewall spacer 114. The etch may, for example, be performed by a dry etch or some other suitable etch process(es). The dry etch may, for example, use a halogen chemistry, a fluorine chemistry, some other suitable chemistry, or some other suitable chemistries. The halogen chemistry may, for example, include chlorine (e.g., $Cl_2$), hydrogen bromide (e.g., HBr), oxygen (e.g., $O_2$), argon, some other suitable halogen(s), or any combination of the foregoing. The fluorine chemistry may, for example, include tetrafluoromethane (e.g., $CF_4$), fluoroform (e.g., $CHF_3$), difluoromethane (e.g., $CH_2F_2$), sulfur hexafluoride (e.g., $SF_6$), hexafluoroethane (e.g., $C_2F_6$), hexafluoropropylene (e.g., $C_3F_6$), octafluorocyclobutane (e.g., $C_4F_8$), perfluorocyclopentene ($C_5F_8$), some other suitable fluorine(s), or any combination of the foregoing.

Figure 14:
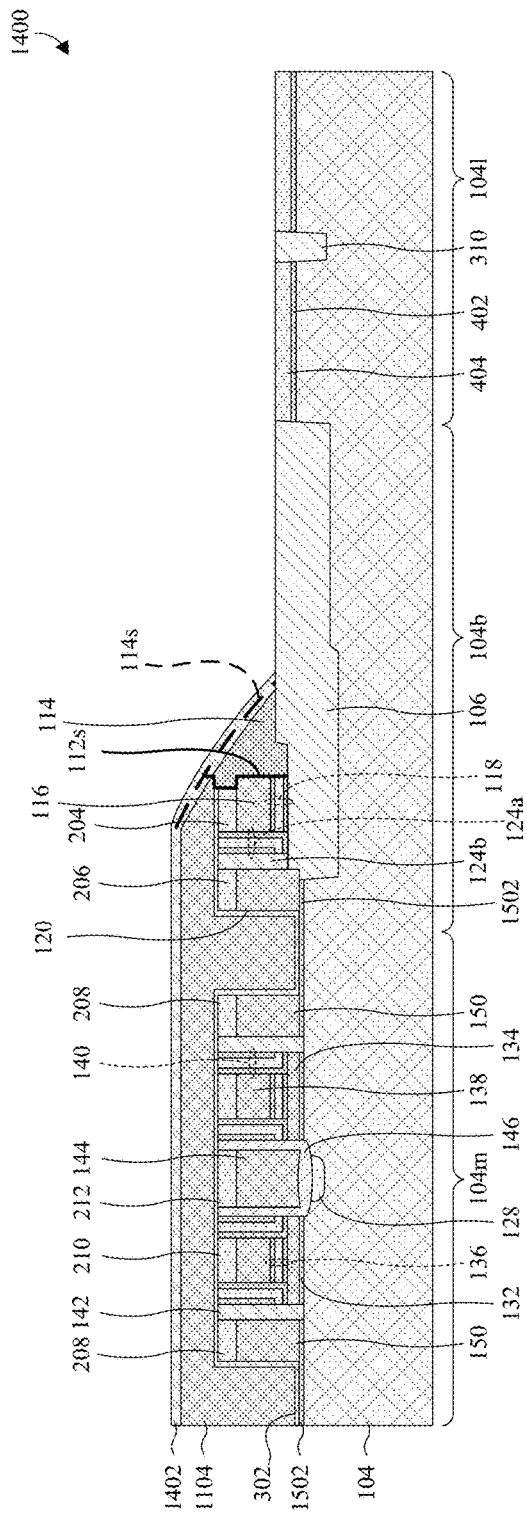

As illustrated by the cross-sectional view 1400 of FIG. 14, a protecting dielectric layer 1402 is formed on a top surface of the boundary sidewall spacer 114. In some embodiments, the protecting dielectric layer 1402 is an oxide layer. The protecting dielectric layer 1402 may be formed by a thermal process without extra mask, such that an uppermost portion of the first dummy capping layer 1104 and the boundary sidewall spacer 114 is oxidized to form the protecting dielectric layer 1402. The protecting dielectric layer 1402 is formed entirely on the first dummy capping layer 1104 and the boundary sidewall spacer 114, and not on the boundary isolation structure 106 or other dielectric features. The protecting dielectric layer 1402 may have a thickness in a range from about 10 Å to about 1000 Å, preferably in a range from about 100 Å to about 200 Å. In some embodiments, the protecting dielectric layer 1402 is formed to have a thickness comparable to a thickness of the lower pad layer 402, or a collective thickness of the lower pad layer 402 and the upper pad layer 404. The protecting dielectric layer 1402 can protect the boundary isolation structure 106 during a pad removal process and prevents the formation of an undercut at a connection point of the boundary sidewall spacer 114 and the boundary isolation structure 106, which is shown and described below associating with FIG. 15.

As illustrated by the cross-sectional view 1500 of FIG. 15, an etch is performed into the upper pad layer 404 and the lower pad layer 402 (see FIG. 14) to remove the upper pad layer 404 and the lower pad layer 402 from the logic region 104l. In some embodiments, the etch results in a logic recesses with sidewalls defined by the boundary and logic isolation structures 106, 310. In some embodiments, the etch is performed with an etchant that has a high etch rate for the upper pad layer 404 relative to the boundary sidewall spacer 114 and the first dummy capping layer 1104, such that the boundary sidewall spacer 114 and the first dummy capping layer 1104 serve as a mask for the etch.

Absent the boundary sidewall spacer 114 and the protecting dielectric layer 1402, the etch into the upper pad layer 404 and the lower pad layer 402 may cause lateral undercutting, divots, and the like to form along the dummy sidewall 112s. For example, the dummy sidewall 112s may be heterogeneous (e.g., multiple materials) and comprise the same material (e.g., silicon nitride) as the upper pad layer 404, whereby the etchant used to remove the upper pad layer 404 may also partially remove a portion of the dummy sidewall 112s. Further, the boundary sidewall spacer 114 provides a smooth boundary sidewall 114s that remains smooth after the etch. For example, the boundary sidewall 114s may be a material for which the etchant used to remove the upper pad layer 404 has a low or negligible etch rate. As another example, the boundary sidewall 114s may be homogenous (e.g., a single material), such that etching to the boundary sidewall 114s is uniform or substantially uniform across the boundary sidewall 114s. Since the boundary sidewall 114s remains smooth after the etch, the boundary sidewall 114s does not trap etch residue (e.g., high κ etch residue) generated during subsequent processing and facilitates complete removal of the etch residue.

As described above, the protecting dielectric layer 1402 (see FIG. 14) and an uppermost portion of the boundary isolation structure 106 are concurrently removed along with the lower pad layer 402. Absent the protecting dielectric layer 1402 formed on the boundary sidewall spacer 114, the boundary sidewall spacer 114 remains unaltered when the boundary isolation structure 106 is concurrently removed with the lower pad layer 402 because of the etching selectivity, and as a result an undercut is formed at a connection point 1502 under the boundary sidewall spacer 114. With the protecting dielectric layer 1402 formed on the boundary sidewall spacer 114, the protecting dielectric layer 1402 can protect the boundary isolation structure 106 during the pad removal process and prevent the formation of an undercut at the connection point 1502 of the boundary sidewall spacer 114 and the boundary isolation structure 106, preventing residue contamination during subsequent processes and thus improve device reliability. The resulting boundary sidewall 114s has an upper portion defined by the boundary sidewall spacer 114 being continuous with and/or flush with a lower portion defined by the boundary isolation structure 106. The boundary sidewall 114s is slanted downward towards the logic device 110. Further, the boundary sidewall 114s is smooth from top to bottom and, in some embodiments, extends continuously from top to bottom. For example, the boundary sidewall 114s may be smooth and/or extend continuously from a top edge of the boundary sidewall 114s to a bottom edge of the boundary sidewall 114s. The top edge of the boundary sidewall 114s may, for example, be even or substantially even with a top edge of the dummy sidewall 112s and/or a top surface of the boundary sidewall spacer 114. The bottom edge of the boundary sidewall 114s may, for example, be spaced above a bottom surface of the boundary sidewall spacer 114.

As illustrated by the cross-sectional view 1600 of FIG. 16, an HV dielectric layer 1602 is formed and patterned to remove from the first logic region 104$l_1$ and to form on the second logic region 104$l_2$. The HV dielectric layer 1602 may, for example, be formed of oxide, a high κ dielectric, some other suitable dielectric(s), or any combination of the foregoing. The HV dielectric layer 1602 may also be formed on the first dummy capping layer 1104 and the boundary sidewall spacer 114. The HV dielectric layer 1602 may be formed conformally, and/or are formed by CVD, PVD, electroless plating, electroplating, some other suitable growth or deposition process(es), or any combination of the foregoing.

Figure 17:
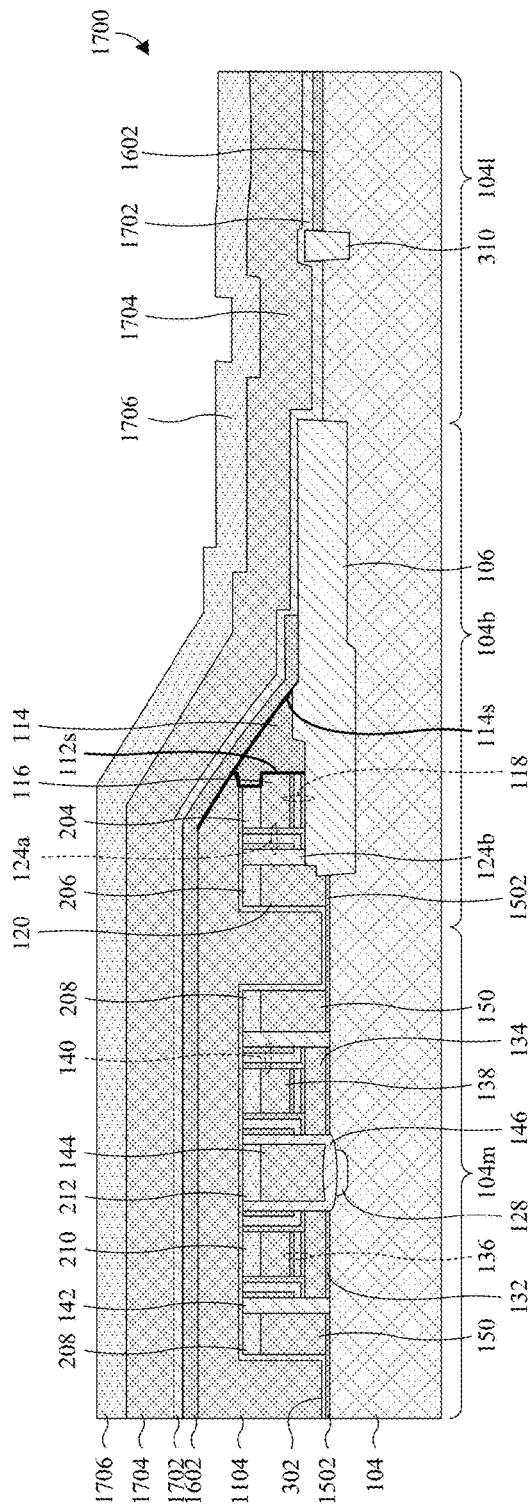

As illustrated by the cross-sectional view 1700 of FIG. 17, a logic dielectric layer 1702 is formed covering and lining the structure of FIG. 16. Further, a logic gate layer 1704 is formed covering the logic dielectric layer 1702, and a logic hard mask layer 1706 is formed covering the logic gate layer 1704. The logic dielectric layer 1702 may, for example, be formed of oxide, a high κ dielectric, some other suitable dielectric(s), or any combination of the foregoing. The logic gate layer 1704 may, for example, be formed of doped or undoped polysilicon, metal, some conductive material, or some other suitable material(s). The logic hard mask layer 1706 may, for example, be formed of silicon nitride, silicon oxide, some other suitable dielectric(s), or any combination of the foregoing. In some embodiments, the logic dielectric layer 1702, the logic gate layer 1704, and the logic hard mask layer 1706 are formed conformally, and/or are formed by CVD, PVD, electroless plating, electroplating, some other suitable growth or deposition process(es), or any combination of the foregoing.

Figure 18:
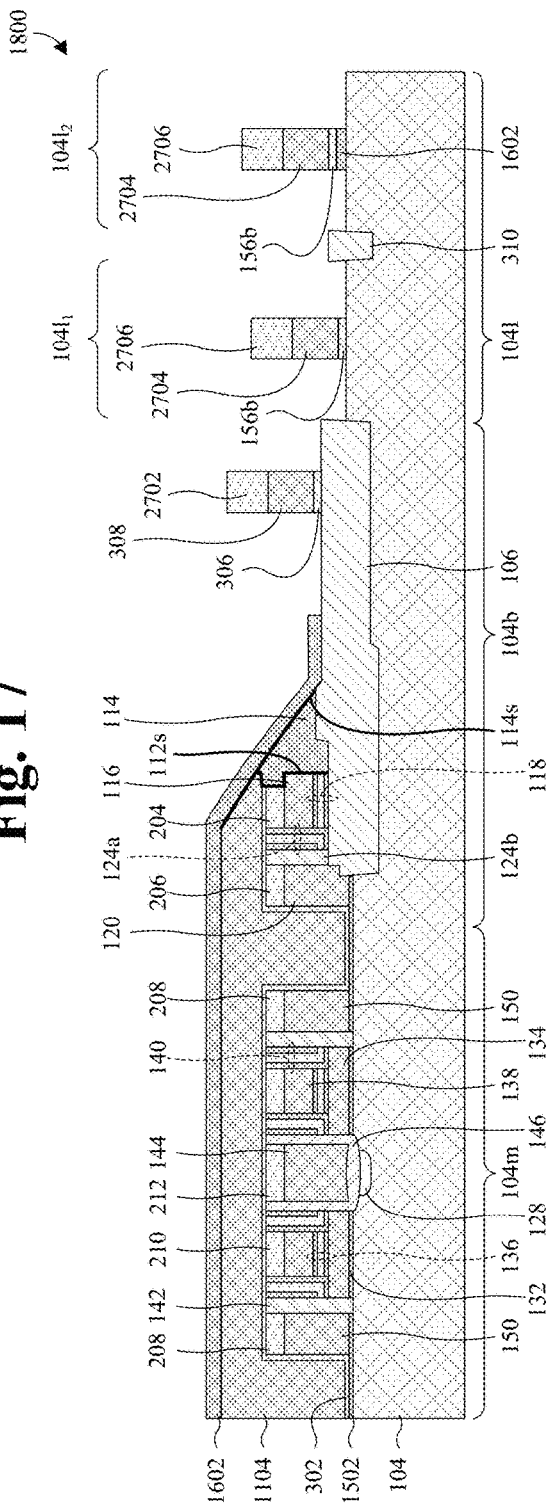

As illustrated by the cross-sectional view 1800 of FIG. 18, an etch is performed into the logic hard mask layer 1706, the logic gate layer 1704, and the logic dielectric layer 1702 (see FIG. 17) to form a dummy logic gate dielectric layer 306, dummy logic gate electrode 308 and a dummy logic gate hard mask 2702. The dummy logic gate dielectric layer 306 and the dummy logic gate electrode 308 overlies the boundary isolation structure 106, laterally between the boundary sidewall spacer 114 and the logic region 104$l$, and the dummy logic gate hard mask 2702 overlies the dummy logic gate electrode 308. Additionally, the etch forms a pair of second logic gate dielectric layers 156b, a pair of sacrificial logic gate electrodes 2704 and a pair of logic gate hard masks 2706. The second logic gate dielectric layers 156b and the sacrificial logic gate electrodes 2704 respectively overlie the first and second logic regions 104$l_1$, 104$l_2$, and the logic gate hard masks 2706 respectively overlie the sacrificial logic gate electrodes 2704.

Figure 19:
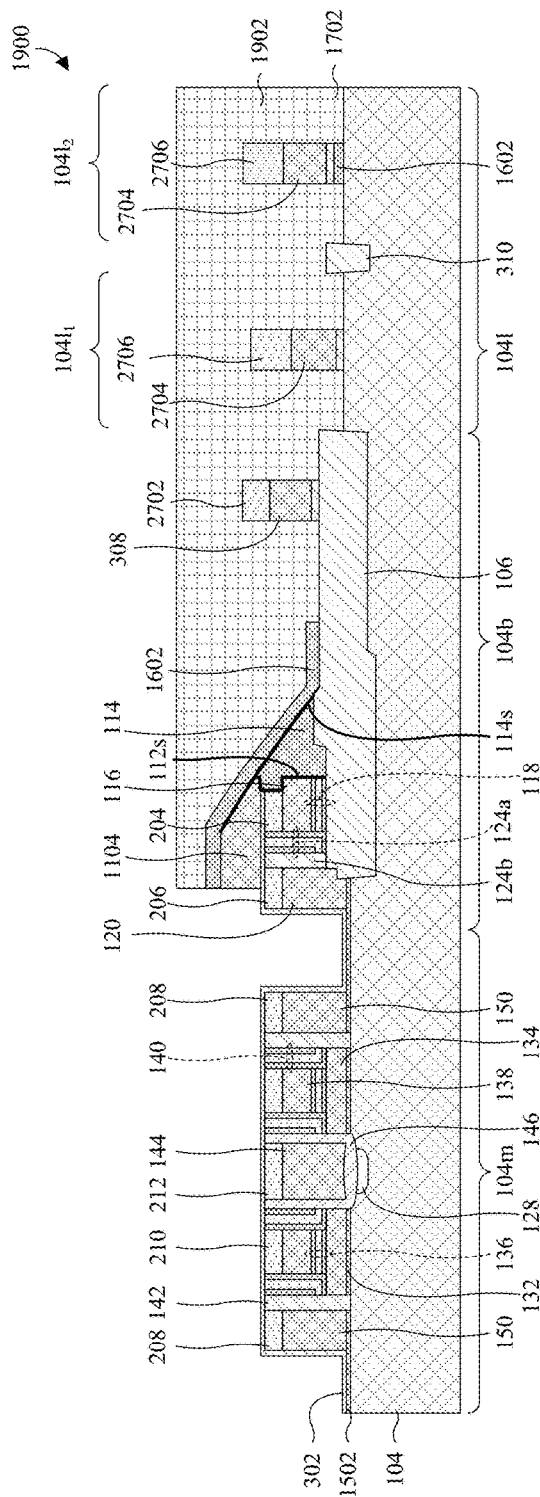

As illustrated by the cross-sectional view 1900 of FIG. 19, an etch is performed into the logic gate dielectric layer 1702 and the first dummy capping layer 1104 to remove the logic gate dielectric layer 1702 and the first dummy capping layer 1104 from the memory region 104m. In some embodiments, the etch is performed by forming and patterning a photoresist layer 1902 covering the logic region 104$l$ and the boundary isolation structure 106, but not the memory region 104m. An etchant is then applied to the logic dielectric layer 1702 and the first dummy capping layer 1104 with the photoresist layer 1902 in place until the etchant reaches the dummy liner layer 302, and the photoresist layer 1902 is thereafter stripped. The dummy liner layer 302 may, for example, serve as an etch stop for the etch.

Figure 20:
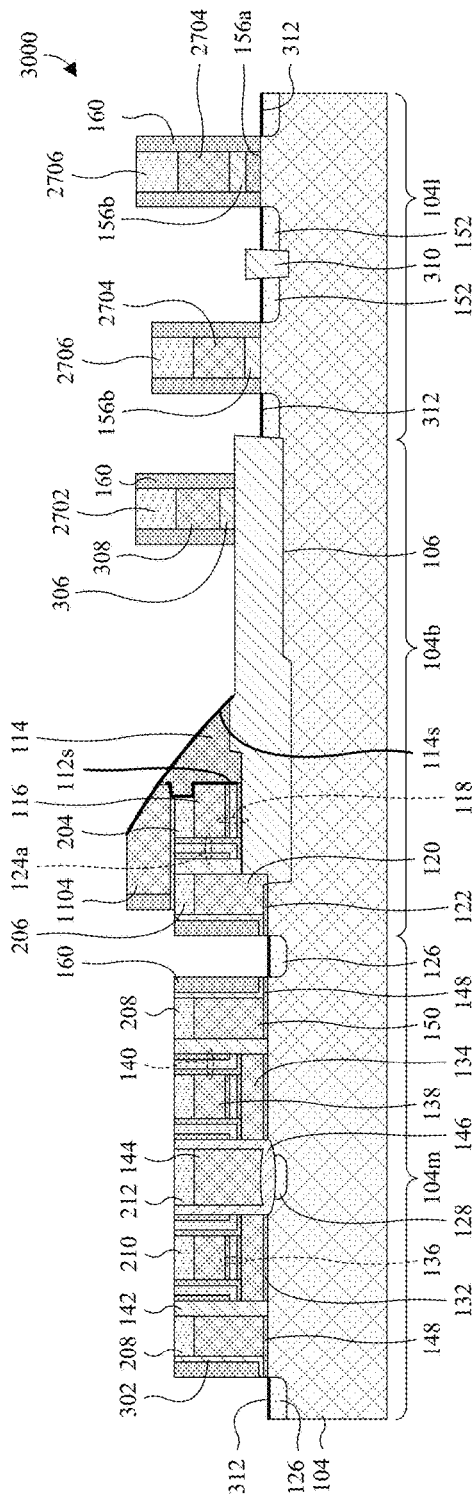

As illustrated by the cross-sectional view 2000 of FIG. 20, a main sidewall spacer 160 is formed along sidewalls of the select gate electrodes 150, a sidewall of the dummy select gate electrode 120, a sidewall of the first dummy capping layer 1104, sidewalls of the dummy logic gate electrode 308, and sidewalls of the sacrificial logic gate electrodes 2704. For ease of illustration, only some of the main sidewall spacers 160 are labeled 160. In some embodiments, the main sidewall spacer 160 comprises silicon oxide, silicon nitride, some other suitable dielectric(s), or any combination of the foregoing. Further, in some embodiments, a process for forming the main sidewall spacer 160 comprises depositing a main boundary sidewall spacer layer covering and lining the structure of FIG. 19. An etch back is then performed into the main boundary sidewall spacer layer to remove horizontal segments of the main boundary sidewall spacer layer without removing vertical segments of the main boundary sidewall spacer layer. The main boundary sidewall spacer layer may, for example, be deposited conformally, and/or may, for example, be formed by CVD, PVD, some other suitable deposition process(es), or any combination of the foregoing.

Also illustrated by the cross-sectional view 2000 of FIG. 20, individual memory source/drain regions 126 are formed in the memory region 104m, respectively bordering the select gate electrodes 150. Further, logic source/drain regions 152 are formed in pairs in the logic region 104l, with the source/drain regions of each pair respectively bordering opposite sidewalls of a sacrificial logic gate electrode 2704. In some embodiments, a process for forming the individual memory source/drain regions 126 and the logic source/drain regions 152 comprises ion implantation into the semiconductor substrate 104. Dopants and/or implant energy may, for example, be selected so as to perform the ion implantation through the dummy liner layer 302, the memory dielectric layer 1502, the logic dielectric layer 1702, and the lower pad layer 402. In other embodiments, some process other than ion implantation is used to form the individual memory source/drain regions 126 and the logic source/drain regions 152.

Also illustrated by the cross-sectional view 2000 of FIG. 20, an etch is performed into the dummy liner layer 302, the memory dielectric layer 1502 (see FIG. 19), and the logic dielectric layer 1702 (see FIG. 19) to remove these layers from the individual memory source/drain regions 126 and the logic source/drain regions 152, thereby exposing the individual memory source/drain regions 126 and the logic source/drain regions 152. Further, the etch forms a pair of select gate dielectric layers 148, a dummy select gate dielectric layer 122, a dummy logic gate dielectric layer 306, and a pair of second logic gate dielectric layers 156b.

Since the formation of the boundary sidewall spacer 114 and the formation and removal of the protecting dielectric layer 1402 (described above with FIGS. 12-15) provide a smooth boundary sidewall 114s devoid of defects, during the etch, the boundary sidewall 114s is not subject to trapping etch residue (e.g., high κ etch residue). This facilitates the complete removal of etch residue. By facilitating complete removal of etch residue, the boundary sidewall spacer 114 may increase yield and the reliability of semiconductor devices (e.g., logic or memory devices) on the semiconductor substrate 104.

Also illustrated by the cross-sectional view 2000 of FIG. 20, silicide pads 312 are formed on the individual memory source/drain regions 126 and the logic source/drain regions 152. For ease of illustration, only some of the silicide pads 312 are labeled 312. The silicide pads 312 may be or otherwise comprise, for example, be nickel silicide or some other suitable silicide(s), and/or may, for example, be formed by a silicide process, or some other suitable growth process(es).

Figure 21:
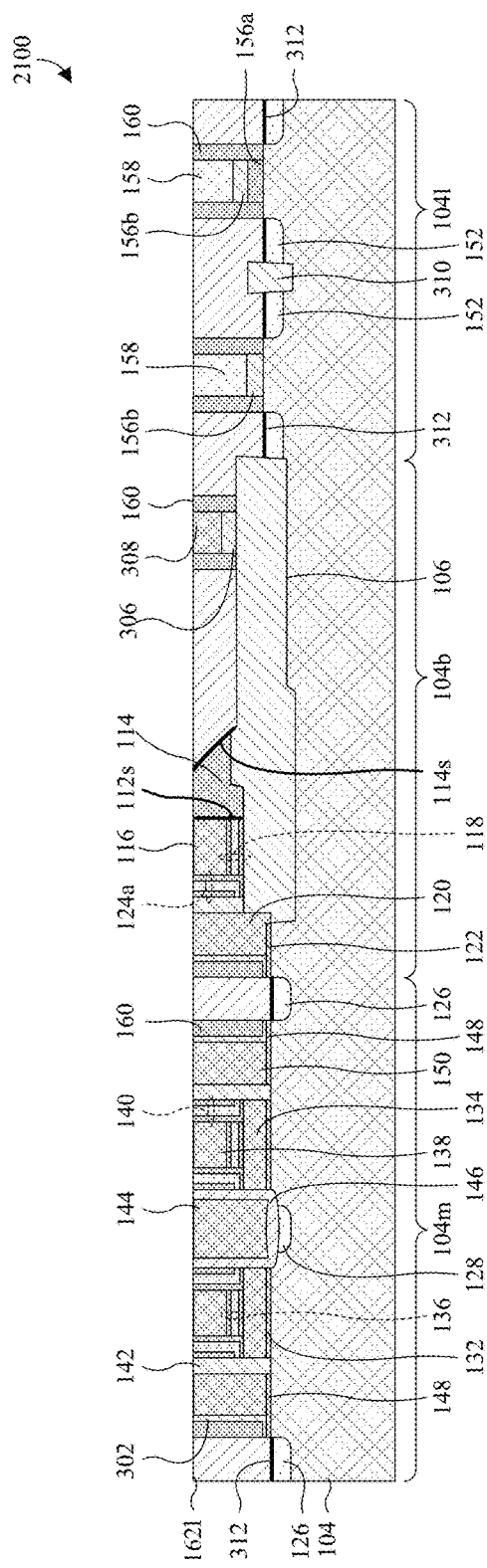

As illustrated by the cross-sectional view 2100 of FIG. 21, a masking layer is formed covering the structure of FIG. 20 followed by a planarization process. The planarization process may remove the control, select, erase, and logic gate hard masks 210, 208, 212, 2706, the dummy control, select, and logic gate hard masks 204, 206, 2702, and the first dummy capping layer 1104 (see FIG. 20). The planarization process may, for example, a CMP or some other suitable planarization process(es).

Also illustrated by the cross-sectional view 2100 of FIG. 21, a lower ILD layer 162l is formed with a top surface that is planar or substantially planar with the planar surface of the structure of FIG. 21. The lower ILD layer 162l may, for example, be oxide, a low κ dielectric, some other suitable dielectric(s), or any combination of the foregoing. The lower ILD layer 162l may, for example, be deposited by CVD, PVD, sputtering, or any combination of the foregoing followed by a planarization process. The planarization process may, for example, a CMP or some other suitable planarization process(es). The planarization process recesses a top surface of the lower ILD layer 162l to about even with top surfaces of the sacrificial logic gate electrodes 2704 (see FIG. 20), thereby exposing the sacrificial logic gate electrodes 2704. A replacement gate process is then performed: an etch is performed into the sacrificial logic gate electrodes 2704 to remove the sacrificial logic gate electrodes 2704. In some embodiments, the etch is performed with a masking layer in place to protect other regions of the structure until the sacrificial logic gate electrodes 2704 are removed. Logic gate electrodes 158 are formed in place of the sacrificial logic gate electrodes 2704. The logic gate electrodes 158 may, for example, be metal, doped polysilicon, a different material than the sacrificial logic gate electrodes 2704, or some other suitable conductive material(s). In some embodiments, a process for forming the logic gate electrodes 158 comprises forming a conductive layer by, for example, by CVD, PVD, electroless plating, electroplating, or some other suitable growth or deposition process(es). A planarization is then performed into the conductive layer until the lower ILD layer 162l is reached. The planarization may, for example, be performed by a CMP or some other suitable planarization process(es).

Figure 22:
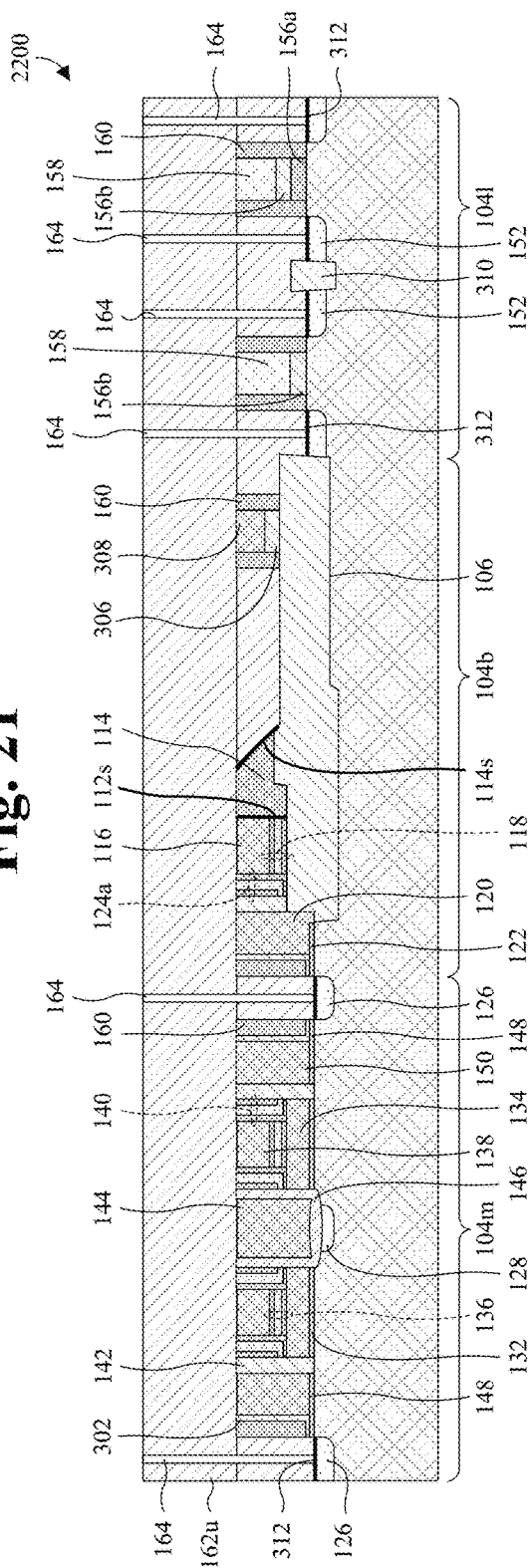

As illustrated by the cross-sectional view 2200 of FIG. 22, an upper ILD layer 162u is formed covering the structure of FIG. 21 and with a top surface that is planar or substantially planar. In some embodiments, the upper ILD layer 162u may, for example, be oxide, a low κ dielectric, some other suitable dielectric(s), or any combination of the foregoing. Further, the upper ILD layer 162u may, for example, be formed depositing the upper ILD layer 162u, and subsequently performing a planarization into the top surface of the upper ILD layer 162u. The deposition may, for example, be performed by CVD, PVD, sputtering, or any combination of the foregoing. The planarization may, for example, be performed by a CMP or some other suitable planarization process(es).

Also illustrated by the cross-sectional view 2200 of FIG. 22, contact vias 164 are formed extending through the upper ILD layer 162u and the lower ILD layer 162l to the individual memory source/drain regions 126, the logic source/drain regions 152, the common memory source/drain region 128, the control gate electrodes 138, the select gate electrodes 150, the erase gate electrode 144, the logic gate electrodes 158, or any combination of the foregoing.

Figure 23:
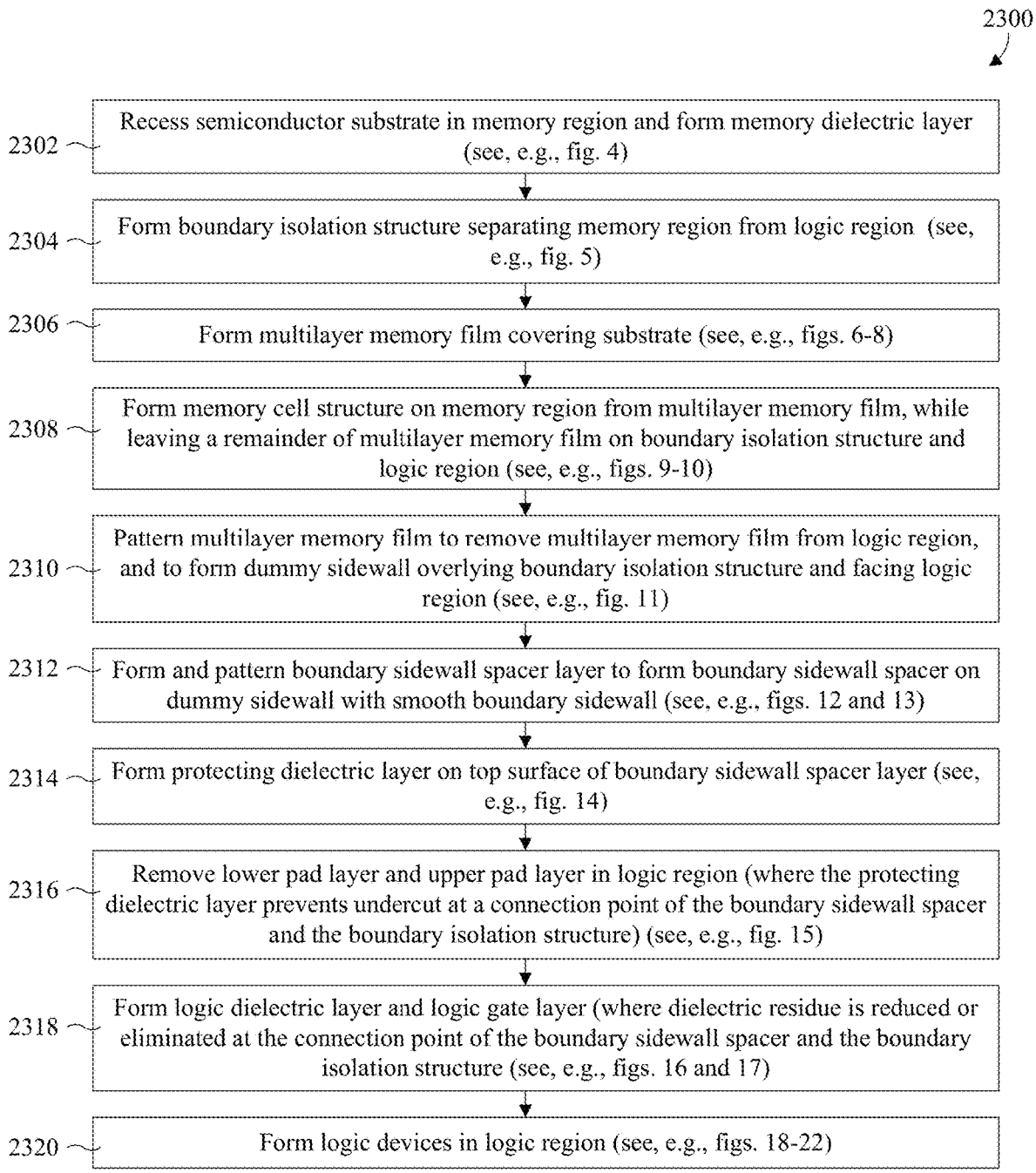
FIG. 23 illustrates a flowchart of some embodiments of the method from FIGS. 4-22.

With reference to FIG. 23, a flowchart 2300 of some embodiments of a method for forming an IC comprising an embedded memory boundary structure with a boundary sidewall spacer is provided. The IC may, for example, correspond to the IC of FIGS. 4-22.

At 2302, a substrate is provided. The substrate comprises a memory region and a logic region. A memory dielectric layer is formed in memory region. See, for example, FIG. 4.

At 2304, a boundary isolation structure is formed separating the memory region from the logic region. See, for example, FIG. 5.

At 2306, a multilayer memory film is formed covering the substrate. See, for example, FIGS. 6-8.

At 2308, a memory cell structure is formed on the memory region from the multilayer memory film, while leaving a remainder of the multilayer memory film on the boundary isolation structure and the logic region. See, for example, FIGS. 9-10.

At 2310, the multilayer memory film is patterned to form a dummy sidewall overlying the boundary isolation structure and facing the logic region. See, for example, FIG. 11.

At 2312, a boundary sidewall spacer layer is formed and patterned to form a boundary sidewall spacer on the dummy sidewall with a smooth boundary sidewall. See, for example, FIGS. 12 and 13.

At 2314, a protecting dielectric layer is formed on a top surface of the boundary sidewall spacer. See, for example, FIG. 14.

At 2316, the lower pad layer and the upper pad layer in logic region are removed concurrently with the protecting dielectric layer. The protecting dielectric layer prevents undercut at a connection point of the boundary sidewall spacer and the boundary isolation structure. See, for example, FIG. 15.

At 2318, a logic dielectric layer and a logic gate layer are formed on the logic region. Dielectric residue is reduced or eliminated at the connection point of the boundary sidewall spacer and the boundary isolation structure. See, for example, FIGS. 16 and 17.

At 2320, logic devices are formed in the logic region. See, for example, FIGS. 18-22.

While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards an integrated circuit (IC). The IC comprises an integrated circuit (IC). The IC comprises a semiconductor substrate including a logic region and a memory region and a dielectric isolation structure disposed between the logic region and the memory region. The IC further comprises a memory cell structure disposed on the memory region and a logic device structure disposed on the logic region and a cell boundary structure disposed on the dielectric isolation structure and comprising a boundary sidewall spacer facing the logic region. The boundary sidewall spacer and an upper portion of the dielectric isolation structure collectively define a boundary sidewall facing the logic region, wherein the boundary sidewall is continuously slanted.

Further, some embodiments of the present application are directed towards an IC. The IC comprises a semiconductor substrate comprising a memory region having a memory cell disposed thereon and a logic region having a logic device disposed thereon. The IC further comprises an isolation structure disposed within a semiconductor substrate and separating the logic and memory regions. The isolation structure comprises dielectric material. The IC further comprises a dummy control gate dielectric layer disposed on the isolation structure and a dummy control gate electrode disposed on the dummy control gate dielectric layer. The IC further comprises a boundary sidewall spacer disposed on the isolation structure along the dummy control gate electrode and the dummy control gate dielectric layer. The boundary sidewall spacer and an uppermost portion of the isolation structure collectively define a boundary sidewall facing the logic region. The boundary sidewall is continuous and slanted downward towards the logic region.

Further, some embodiments of the present application are directed towards an integrated circuit (IC). The IC comprises a semiconductor substrate comprising a memory region having a memory cell disposed thereon and a logic region having a logic device disposed thereon and an isolation structure disposed within a semiconductor substrate and separating the logic region and the memory region, the isolation structure comprising dielectric material. The IC further comprises a dummy control gate dielectric layer disposed on the isolation structure and a dummy control gate electrode disposed on the dummy control gate dielectric layer and a boundary sidewall spacer disposed on the isolation structure along the dummy control gate electrode and the dummy control gate dielectric layer. The boundary sidewall spacer and an uppermost portion of the isolation structure collectively define a boundary sidewall facing the logic region, wherein the boundary sidewall is continuous and slanted downward towards the logic region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit (IC), comprising:
   a semiconductor substrate including a logic region and a memory region;
   a dielectric isolation structure disposed between the logic region and the memory region;
   a memory cell structure disposed on the memory region and a logic device structure disposed on the logic region; and
   a cell boundary structure disposed on the dielectric isolation structure and comprising a boundary sidewall spacer facing the logic region;
   wherein the boundary sidewall spacer and an upper portion of the dielectric isolation structure collectively define a boundary sidewall facing the logic region, wherein the boundary sidewall is continuously slanted, and
   wherein the boundary sidewall spacer comprises a sidewall different than the boundary sidewall that directly contacts the dielectric isolation structure.

2. The IC according to claim 1, wherein the cell boundary structure further comprises a dummy control gate structure, wherein the dummy control gate structure comprises multiple different materials.

3. The IC according to claim 1, wherein the boundary sidewall spacer comprises silicon oxide, silicon nitride, silicon oxynitride, polysilicon, aluminum copper, tantalum, or the combination thereof.

4. The IC according to claim 1, wherein the cell boundary structure further comprises a dummy control gate structure separated from the dielectric isolation structure by a dummy control gate dielectric layer, wherein the dummy control gate structure and the dummy control gate dielectric layer collectively define a planar dummy sidewall that faces the logic region and that comprises multiple different materials.

5. The IC according to claim 4, wherein the cell boundary structure further comprises a dummy gate spacer disposed on the dielectric isolation structure and having a bottom surface aligned with that of the dummy control gate dielectric layer.

6. The IC according to claim 4, further comprises:
a dummy select gate electrode disposed on the dielectric isolation structure;
wherein the dummy select gate electrode has a bottom surface lower than that of the dummy control gate dielectric layer.

7. The IC according to claim 4, wherein the dummy control gate dielectric layer comprises a multilayer oxide-nitride-oxide (ONO) film.

8. The IC according to claim 1, wherein the logic device structure comprises a metal gate electrode and a high κ gate dielectric layer stacked on the logic region.

9. An integrated circuit (IC) comprising:
an isolation structure disposed within a semiconductor substrate and separating a logic region and a memory region of the semiconductor substrate, the isolation structure comprising dielectric material;
a memory cell disposed in the memory region;
a dummy control gate structure disposed on the isolation structure, wherein the dummy control gate structure defines a dummy sidewall that faces the logic region and that comprises multiple different materials;
a boundary sidewall spacer disposed on the isolation structure along the dummy sidewall of the dummy control gate structure, wherein the boundary sidewall spacer and an uppermost portion of the isolation structure collectively define a boundary sidewall facing and continuously slanted downward towards the logic region; and
a logic device disposed on the logic region,
wherein the dummy sidewall has an upper vertical portion and a lower vertical portion connected by a lateral portion, wherein the upper vertical portion is recessed toward the memory region relative to the lower vertical portion.

10. The IC according to claim 9, wherein the boundary sidewall extends continuously from top to bottom.

11. The IC according to claim 9, wherein the boundary sidewall is at an angle of less than about 60 degrees relative to a lateral planar surface of the boundary sidewall spacer.

12. The IC according to claim 9, wherein the dummy control gate structure comprises an oxide-nitride-oxide (ONO) film and a dummy gate electrode overlying the ONO film.

13. The IC according to claim 9, wherein the boundary sidewall spacer directly contacts the dummy sidewall.

14. An integrated circuit (IC) comprising:
a semiconductor substrate comprising a memory region having a memory cell disposed thereon and a logic region having a logic device disposed thereon;
an isolation structure disposed within the semiconductor substrate and separating the logic region and the memory region, the isolation structure comprising dielectric material;
a dummy control gate dielectric layer disposed on the isolation structure and a dummy control gate electrode disposed on the dummy control gate dielectric layer; and
a boundary sidewall spacer disposed on the isolation structure along the dummy control gate electrode and the dummy control gate dielectric layer;
wherein the boundary sidewall spacer and an uppermost portion of the isolation structure collectively define a boundary sidewall facing the logic region, wherein the boundary sidewall is continuous and slanted downward towards the logic region, and
wherein the boundary sidewall spacer comprises a bottom surface that is below a top surface of the isolation structure.

15. The IC according to claim 14, further comprises:
a logic boundary structure disposed on the isolation structure, the logic boundary structure comprises a dummy logic gate dielectric layer and a dummy logic gate electrode overlying the dummy logic gate dielectric layer.

16. The IC according to claim 14, further comprises:
a first dummy gate spacer and a second dummy gate spacer disposed on the isolation structure;
wherein the first dummy gate spacer and the second dummy gate spacer have bottom surfaces co-planar with that of the dummy control gate dielectric layer.

17. The IC according to claim 14, further comprises:
a dummy select gate electrode disposed on the isolation structure;
wherein the dummy select gate electrode has a bottom surface lower than that of the dummy control gate dielectric layer.

18. The IC according to claim 14, wherein the memory cell comprises:
first and second individual source/drain regions in the semiconductor substrate;
a common source/drain region in the semiconductor substrate, laterally spaced between the first and second individual source/drain regions, wherein the common source/drain region is separated from the first individual source/drain region by a first channel region, and wherein the common source/drain region is separated from the second individual source/drain region by a second channel region;
an erase gate electrode on the common source/drain region;
a pair of floating gate electrodes respectively on the first and second channel regions;
a pair of control gate electrodes respectively overlying the floating gate electrodes; and
a pair of select gate electrodes respectively on the first and second channel regions, and laterally spaced from the common source/drain region respectively by the floating gate electrodes.

19. The IC according to claim 14, wherein the logic device comprises:
a high κ gate dielectric layer; and
a metal gate electrode overlying the high κ gate dielectric layer.

20. The IC according to claim 9, wherein the boundary sidewall spacer comprises a sidewall different than the boundary sidewall that directly contacts the isolation structure.

\* \* \* \* \*